(12) United States Patent
Kamakura et al.

(10) Patent No.: US 11,251,039 B2
(45) Date of Patent: Feb. 15, 2022

(54) METHOD OF MANUFACTURING SEMICONDUCTOR DEVICE, RECORDING MEDIUM, AND SUBSTRATE PROCESSING METHOD

(71) Applicant: KOKUSAI ELECTRIC CORPORATION, Tokyo (JP)

(72) Inventors: Tsukasa Kamakura, Toyama (JP); Takaaki Noda, Toyama (JP); Yoshiro Hirose, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/845,625

(22) Filed: Apr. 10, 2020

(65) Prior Publication Data

US 2020/0243325 A1 Jul. 30, 2020

Related U.S. Application Data

(62) Division of application No. 15/085,459, filed on Mar. 30, 2016, now abandoned.

(30) Foreign Application Priority Data

Apr. 28, 2015 (JP) ................................. 2015-092429

(51) Int. Cl.
*H01L 21/02* (2006.01)
*C23C 16/40* (2006.01)
*C23C 16/455* (2006.01)

(52) U.S. Cl.
CPC ........ *H01L 21/0228* (2013.01); *C23C 16/402* (2013.01); *C23C 16/45534* (2013.01);
(Continued)

(58) Field of Classification Search
CPC ........... H01L 21/0228; H01L 21/02236; H01L 21/02274
See application file for complete search history.

(56) References Cited

U.S. PATENT DOCUMENTS 5,563,104 A 10/1996 Jang et al.
6,617,224 B2 * 9/2003 Yu ..................... H01L 21/02164
257/E21.279
(Continued)

FOREIGN PATENT DOCUMENTS

| JP | 2004-040110 A | 2/2004 |
|---|---|---|
| JP | 2009-111042 A | 5/2009 |
| JP | 2012-114223 A | 6/2012 |

OTHER PUBLICATIONS

Non-Final Office Action dated Dec. 8, 2020 for U.S. Appl. No. 16/845,562.

*Primary Examiner* — Tuan A Hoang
(74) *Attorney, Agent, or Firm* — Volpe Koenig

(57) ABSTRACT

A film where a first layer and a second layer are laminated is formed on a substrate by performing: forming the first layer by performing a first cycle a predetermined number of times, the first cycle including non-simultaneously performing: supplying a source to the substrate, and supplying a reactant to the substrate, under a first temperature at which neither the source nor the reactant is thermally decomposed when the source and the reactant are present alone, respectively; and forming the second layer by performing a second cycle a predetermined number of times, the second cycle including non-simultaneously performing: supplying the source to the substrate, and supplying the reactant to the substrate, under a second temperature at which neither the source nor the reactant is thermally decomposed when the (Continued)

source and the reactant are present alone, respectively, the second temperature being different from the first temperature.

21 Claims, 10 Drawing Sheets

(52) U.S. Cl.
CPC ...... *H01L 21/022* (2013.01); *H01L 21/02164* (2013.01); *H01L 21/02211* (2013.01); *H01L 21/02219* (2013.01); *H01L 21/02274* (2013.01); *H01L 21/02277* (2013.01)

(56) References Cited

U.S. PATENT DOCUMENTS

| | | | |
|---|---|---|---|
| 2004/0018694 A1* | 1/2004 | Lee | H01L 21/31612 |
| | | | 438/400 |
| 2008/0081104 A1 | 4/2008 | Hasebe | |
| 2009/0042404 A1 | 2/2009 | Surthi | |
| 2009/0110824 A1 | 4/2009 | Takenaga et al. | |
| 2009/0117750 A1* | 5/2009 | OuYang | H01L 29/42364 |
| | | | 438/769 |
| 2012/0126355 A1 | 5/2012 | Mizuno et al. | |
| 2014/0141542 A1* | 5/2014 | Kang | H01L 22/26 |
| | | | 438/14 |
| 2016/0020092 A1* | 1/2016 | Kang | C23C 16/402 |
| | | | 438/761 |

* cited by examiner

FIG. 12A

| NAME | PYRIDINE | AMINOPYRIDINE | PICOLINE | LUTIDINE | PIPERAZINE | PIPERIDINE |
|---|---|---|---|---|---|---|
| COMPOSITION FORMULA | $C_5H_5N$ | $C_5H_6N_2$ | $C_6H_7N$ | $C_7H_9N$ | $C_4H_{10}N_2$ | $C_5H_{11}N$ |
| STRUCTURAL FORMULA | | | | | | |
| ACID DISSOCIATION CONSTANT (pKa) | 5.67 | 6.89 | 6.07 | 6.96 | 9.80 | 11.12 |

FIG. 12B

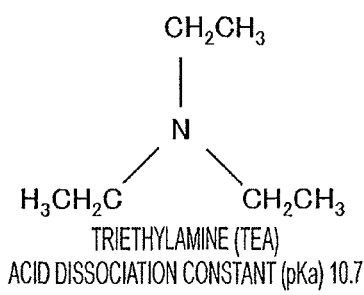

TRIETHYLAMINE (TEA)
ACID DISSOCIATION CONSTANT (pKa) 10.7

FIG. 12C

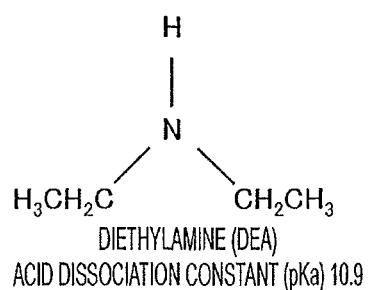

DIETHYLAMINE (DEA)
ACID DISSOCIATION CONSTANT (pKa) 10.9

FIG. 12D

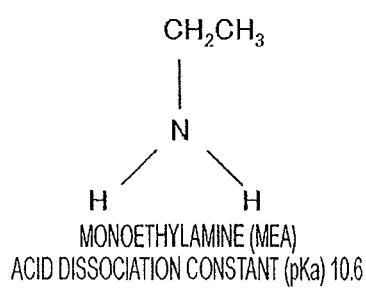

MONOETHYLAMINE (MEA)
ACID DISSOCIATION CONSTANT (pKa) 10.6

FIG. 12E

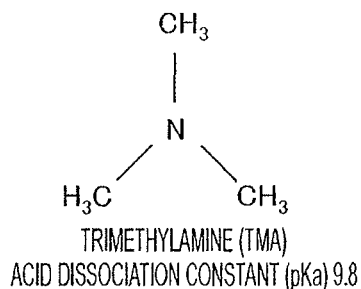

TRIMETHYLAMINE (TMA)
ACID DISSOCIATION CONSTANT (pKa) 9.8

FIG. 12F

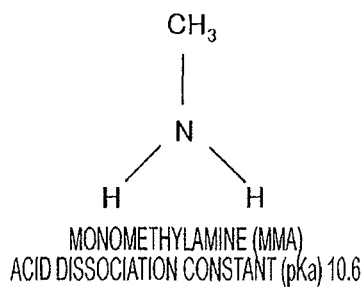

MONOMETHYLAMINE (MMA)
ACID DISSOCIATION CONSTANT (pKa) 10.6

METHOD OF MANUFACTURING SEMICONDUCTOR DEVICE, RECORDING MEDIUM, AND SUBSTRATE PROCESSING METHOD

CROSS REFERENCE TO RELATED APPLICATION

This application is a divisional of U.S. patent application Ser. No. 15/085,459, filed May 30, 2016, which is incorporated by reference as if fully set forth.

BACKGROUND

Technical Field

The present invention relates to a method of manufacturing a semiconductor device, a substrate processing apparatus, and a non-transitory recording medium.

Related Art

As one of the processes of manufacturing a semiconductor device, a process of forming a film on a substrate in a process chamber is performed by supplying a source and a reactant to the substrate (see, for example, JP 2012-114223 A).

SUMMARY

The present teachings provide a technology that is capable of improving a film thickness controllability of a film to be formed on a substrate.

According to one aspect, there is provided a technology for forming a film where a first layer and a second layer are laminated on a substrate by performing: (a) forming the first layer by performing a first cycle a predetermined number of times, the first cycle including non-simultaneously performing: (a-1) supplying a source to the substrate, and (a-2) supplying a reactant to the substrate, under a first temperature at which neither the source nor the reactant is thermally decomposed when the source and the reactant are present alone, respectively; and (b) forming the second layer by performing a second cycle a predetermined number of times, the second cycle including non-simultaneously performing: (b-1) supplying the source to the substrate, and (b-2) supplying the reactant to the substrate, under a second temperature at which neither the source nor the reactant is thermally decomposed when the source and the reactant are present alone, respectively, the second temperature being different from the first temperature.

According to the present teachings, it is possible to improve a film thickness controllability of a film to be formed on a substrate.

BRIEF DESCRIPTION OF DRAWINGS

FIG. 12A is a diagram illustrating a chemical structural formula or the like of cyclic amine, FIG. 12B is a diagram illustrating a chemical structural formula or the like of TEA that is chain amine, FIG. 12C is a diagram illustrating a chemical structural formula or the like of DEA that is chain amine, FIG. 12D is a diagram illustrating a chemical structural formula of MEA that is chain amine, FIG. 12E is a diagram illustrating a chemical structural formula or the like of TMA that is chain amine, and FIG. 12F is a diagram illustrating a chemical structural formula or the like of MMA that is chain amine;

DETAILED DESCRIPTION

Hereinafter, an embodiment will be described with reference to FIGS. 1 to 3.

(1) Configuration of Substrate Processing Apparatus

Figure 1:
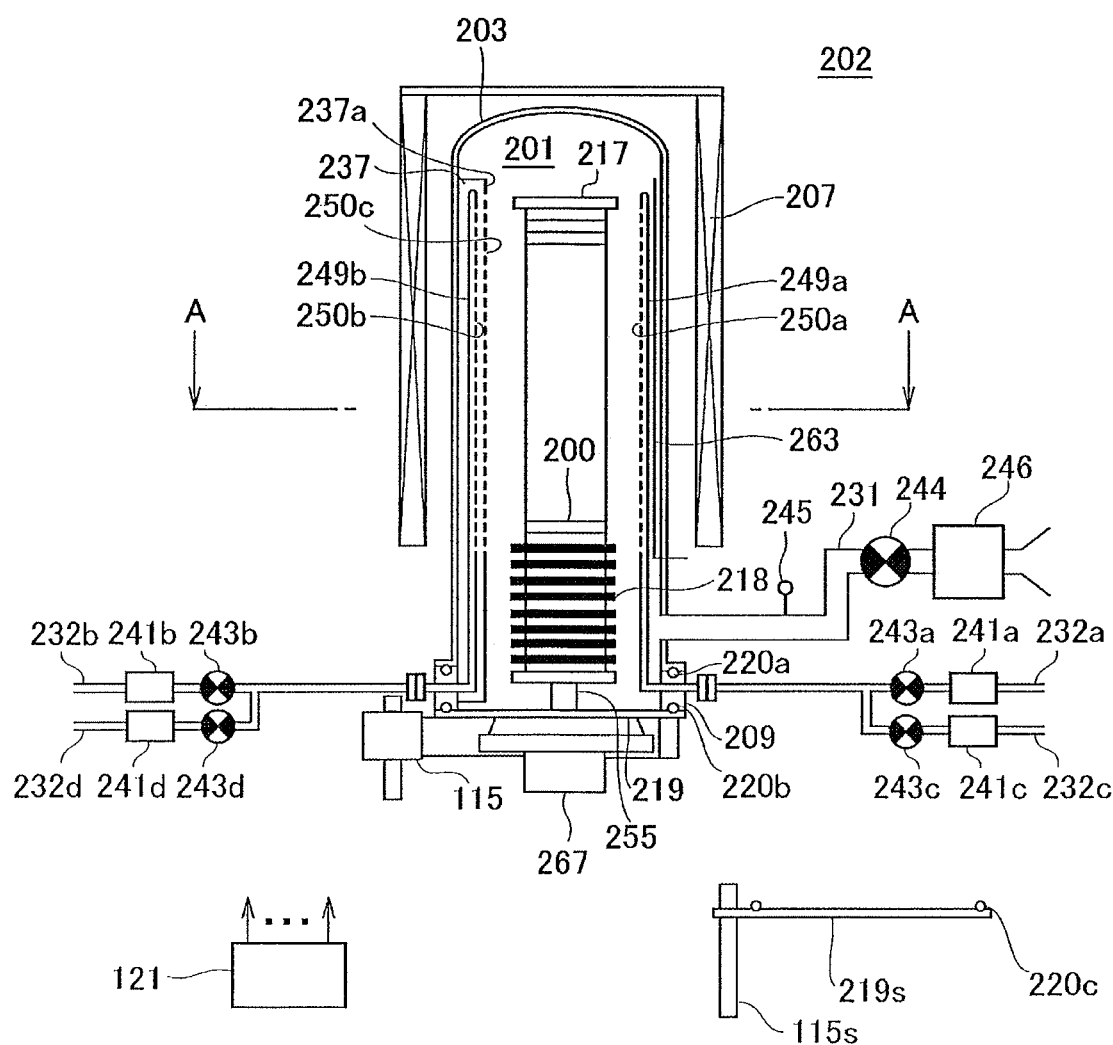
FIG. 1 is a schematic configuration diagram of a vertical process furnace of a substrate processing apparatus suitably used in an embodiment and a longitudinal sectional view of a process furnace part.

As illustrated in FIG. 1, a process furnace 202 includes a heater 207 serving as a temperature regulation section (heating mechanism). The heater 207 has a cylindrical shape and is supported to a heater base (not illustrated) serving as a holding plate so that the heater 207 is vertically installed. As described later, the heater 207 functions as an activation mechanism (excitation section) that activates (excites) a gas by heat.

Inside the heater 207, a reaction tube 203 is disposed concentrically with the heater 207. The reaction tube 203 is made of a heat resistant material, such as quartz ($SiO_2$) or silicon carbide (SiC), and is formed to have a cylindrical shape with a closed upper end and an opened lower end.

Under the reaction tube 203, amanifold (inlet flange) 209 is disposed concentrically with the reaction tube 203. The manifold 209 is made of a metal, such as stainless steel (SUS), and is formed to have a cylindrical shape with opened upper and lower ends. An upper part of the manifold 209 is configured to be engaged with a lower part of the reaction tube 203 so as to support the reaction tube 203. An O-ring 220a serving as a seal member is provided between the manifold 209 and the reaction tube 203. Since the manifold 209 is supported to the heater base, the reaction tube 203 is in a state of being vertically installed. The process vessel (reaction vessel) is configured by, mainly, the reaction tube 203 and the manifold 209. A process chamber 201 is formed in a cylindrical hollow part of the process vessel. The process chamber 201 is configured such that wafers 200 as a plurality of sheets of substrates are accommodated in a state of being aligned vertically in a horizontal posture and in multiple stages by a boat 217 to be described below.

In the process chamber 201, nozzles 249a and 249b are provided to pass through a sidewall of the manifold 209. Gas supply pipes 232a and 232b are respectively connected to the nozzles 249a and 249b. As such, the two nozzles 249a and 249b and the two gas supply pipes 232a and 232b are provided in the reaction tube 203, such that a plurality of types of gases are supplied into the process chamber 201.

Mass flow controllers (MFCs) 241a and 241b serving as flow rate controllers (flow rate control units) and valves 243a and 243b serving as on-off valves are respectively provided in the gas supply pipes 232a and 232b in this order from an upstream direction. Gas supply pipes 232c and 232d configured to supply an inert gas are respectively connected to downstream sides of the valves 243a and 243b of the gas supply pipes 232a and 232b. MFCs 241c and 241d serving as flow rate controllers (flow rate control units) and valves 243c and 243d serving as on-off valves are respectively provided in the gas supply pipes 232c and 232d in this order from the upstream direction.

The nozzle 249a is connected to a tip end portion of the gas supply pipe 232a. As illustrated in FIG. 2, the nozzle 249a is provided in an annular space between an inner wall of the reaction tube 203 and the wafers 200, when seen in a plan view, so as to rise upward in a stacking direction of the wafers 200, extending from a lower part to an upper part of the inner wall of the reaction tube 203. That is, the nozzle 249a is provided in a region horizontally surrounding a wafer arrangement region, at a side of the wafer arrangement region in which the wafers 200 are arranged, so as to extend along the wafer arrangement region. In other words, the nozzle 249a is provided perpendicular to a surface (flat surface) of the wafer 200 at a side of an edge (periphery) of each wafer 200 loaded into the process chamber 201. The nozzle 249a is configured as an L-shaped long nozzle, of which a horizontal portion is provided so as to pass through the sidewall of the manifold 209 and of which a vertical portion is provided so as to rise from at least one end side toward the other end side of the wafer arrangement region. A gas supply hole 250a configured to supply a gas is provided on a side surface of the nozzle 249a. The gas supply hole 250a is opened to face the center of the reaction tube 203, so that the gas is supplied toward the wafers 200. The gas supply hole 250a is plurally provided from the lower part to the upper part of the reaction tube 203, such that the plurality of gas supply holes 250a have the same opening area and are provided at the same opening pitch.

The nozzle 249b is connected to a tip end part of the gas supply pipe 232b. The nozzle 249b is provided in a buffer chamber 237 that is a gas distribution space. The buffer chamber 237 is formed between the inner wall of the reaction tube 203 and a partition wall 237a. As illustrated in FIG. 2, the buffer chamber 237 (partition wall 237a) is provided in the annular space between the inner wall of the reaction tube 203 and the wafers 200, when seen in a plan view, in the region from the lower part to the upper part of the inner wall of the reaction tube 203 in the stacking direction of the wafers 200. That is, the buffer chamber 237 (partition wall 237a) is provided in a region horizontally surrounding the wafer arrangement region, at the side of the wafer arrangement region, so as to extend along the wafer arrangement region. A gas supply hole 250c configured to supply a gas is provided at an end part of a surface of the partition wall 237a facing (adjacent to) the wafer 200. The gas supply hole 250c is opened to face the center of the reaction tube 203, so that the gas is supplied toward the wafer 200. The gas supply hole 250c is plurally provided from the lower part to the upper part of the reaction tube 203, such that the plurality of gas supply holes 250c have the same opening area and are provided at the same opening pitch.

The nozzle 249b is provided at the end part of the buffer chamber 237 where the gas supply holes 250c are provided, so as to rise upward in the stacking direction of the wafers 200, extending from the lower part to the upper part of the inner wall of the reaction tube 203. That is, the nozzle 249b is provided in a region horizontally surrounding a wafer arrangement region, at a side of the wafer arrangement region in which the wafers 200 are arranged, so as to extend along the wafer arrangement region. That is, the nozzle 249b is provided vertically to the surface of the wafer 200 at the side of the edge of the wafer 200 loaded into the process chamber 201. The nozzle 249b is configured as an L-shaped long nozzle, of which a horizontal portion is provided so as to pass through the sidewall of the manifold 209 and of which a vertical portion is provided so as to rise from at least one end side toward the other end side of the wafer arrangement region. A gas supply hole 250b configured to supply a gas is provided on a side surface of the nozzle 249b. The gas supply hole 250b is opened to face the center of the buffer chamber 237. Similar to the gas supply holes 250c, the gas supply hole 250b is plurally provided from the lower part to the upper part of the reaction tube 203. When a pressure difference between the buffer chamber 237 and the process chamber 201 is small, the opening areas and the opening pitches of the plurality of gas supply holes 250b may be made equal to each other from the upstream side (lower part) to the downstream side (upper part). In addition, when the pressure difference between the buffer chamber 237 and the process chamber 201 is large, the opening areas of the gas supply holes 250b may be gradually increased from the upstream side toward the downstream side, and the opening pitches of the gas supply holes 250b may be gradually decreased from the upstream side toward the downstream side.

Although there is a difference in a flow velocity, a certain gas can be ejected at a substantially equal flow rate from each of the gas supply holes 250b by adjusting the opening area or the opening pitch of each of the gas supply holes 250b from the upstream side to the downstream side as described above. It is possible to perform equalization of the difference in the gas flow velocity in the buffer chamber 237 by introducing the gas ejected from each of the plurality of gas supply holes 250b into the buffer chamber 237. The gases ejected from the plurality of gas supply holes 250b into the buffer chamber 237 are ejected from the plurality of gas supply holes 250c into the process chamber 201 after the particle velocity is relaxed in the buffer chamber 237. The gas ejected from each of the plurality of gas supply holes 250b into the buffer chamber 237 becomes a gas having a uniform flow rate and a uniform flow velocity when the gas is ejected from each of the gas supply holes 250c into the process chamber 201.

As such, in the present embodiment, the gas is transferred through the nozzles 249a and 249b and the buffer chamber 237 disposed in the annular elongated space, when seen in a plan view, that is, the cylindrical space, which is defined by the inner wall of the sidewall of the reaction tube 203 and the ends (peripheries) of the plurality of sheets of wafers 200 arranged in the reaction tube 203. The gas is ejected from the gas supply holes 250a to 250c, which are respectively opened in the nozzles 249a and 249b and the buffer chamber 237, to the reaction tube 203 for the first time in the vicinity of the wafer 200. A main flow of the gas in the reaction tube 203 is a direction parallel to the surface of the wafer 200, that is, a horizontal direction. Due to such a configuration, it is possible to uniformly supply the gas to each of the wafers 200 and to improve the film thickness uniformity of a thin film formed in each of the wafers 200. A gas flowing on the surface of the wafer 200, that is, a gas remaining after reaction, flows in a direction of an exhaust port, that is, the exhaust pipe 231 to be described below. However, the direction of the flow of the remaining gas is appropriately specified according to the position of the exhaust port and is not limited to a vertical direction.

As a source containing a predetermined element, for example, a silane source gas containing silicon (Si) as a predetermined element is supplied from the gas supply pipe 232a to the process chamber 201 through the MFC 241a, the valve 243a, and the nozzle 249a.

The silane source gas is a silane source of a gaseous state, for example, a gas obtained by vaporizing a silane source that is in a liquid state under normal temperature and normal pressure, or a silane source that is in a gaseous state under normal temperature and normal pressure. A case where the term "source" is used in this disclosure is a case that means "a liquid source that is in a liquid state", a case that means a "source gas that is in a gaseous state", or a case that means both of them.

As the silane source gas, for example, a source gas containing Si and a halogen group, that is, a halosilane source gas can be used. The halosilane source is a silane source having a halogen group. The halogen group includes a chloro group, a fluoro group, a bromo group, an iodine group, and the like. That is, the halogen group includes a halogen element, such as chlorine (Cl), fluorine (F), bromine (Br), and iodine (I). It can be said that the halosilane source is a type of a halide.

Figure 8A:
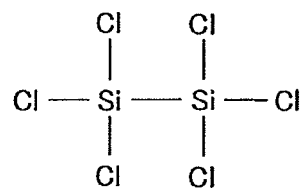
FIG. 8A is a diagram illustrating a chemical structural formula of HCDS.
Figure 8B:
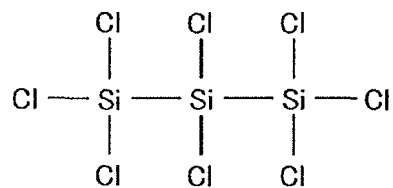
FIG. 8B is a diagram illustrating a chemical structural formula of OCTS.

As the halosilane source gas, for example, a carbon (C)-free source gas containing Si and Cl, that is, an inorganic chlorosilane source gas can be used. As the inorganic chlorosilane source gas, for example, hexachlorodisilane ($Si_2Cl_6$, abbreviated to HCDS) gas, octachlorotrisilane ($Si_3Cl_8$, abbreviated to OCTS) gas, or the like can be used. FIG. 8A illustrates a chemical structural formula of HCDS, and FIG. 8B illustrates a chemical structural formula of OCTS. It can be said that these gases are a source gas that includes at least two Si per molecule, further includes Cl, and has a Si—Si bond and a Si—Cl bond. These gases act as a Si source in a film-forming process to be described below.

Figure 9A:
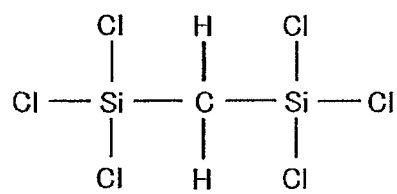
FIG. 9A is a diagram illustrating a chemical structural formula of BTCSM.
Figure 9B:
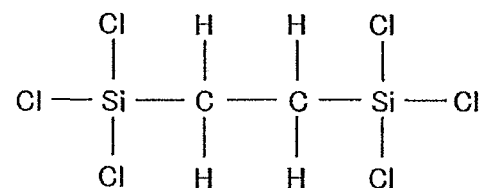
FIG. 9B is a diagram illustrating a chemical structural formula of BTCSE.

In addition, as the halosilane source gas, for example, a source gas containing Si, Cl, and an alkylene group and having a Si—C bond, that is, an alkylene chlorosilane source gas being an organic chlorosilane source gas may also be used. The alkylene group includes a methylene group, an ethylene group, a propylene group, a butylene group, or the like. The alkylene chlorosilane source gas can also be referred to as an alkylene halosilane source gas. As the alkylene chlorosilane source gas, for example, bis(trichlorosilyl)methane (($SiCl_3)_2CH_2$, abbreviated to BTCSM) gas, ethylenebis(trichlorosilane) gas, that is, 1,2-bis(trichlorosilyl)ethane (($SiCl_3)_2C_2H_4$, abbreviated to BTCSE) gas, or the like can be used. FIG. 9A illustrates a chemical structural formula of BTCSM, and FIG. 9B illustrates a chemical structural formula of BTCSE. It can be said that these gases are a source gas that includes at least two Si per molecule, further includes C and Cl, and has a Si—C bond, a Si—Cl bond, or the like. In a film-forming process to be described below, these gases also act as a Si source and also act as a C source.

Figure 10A:
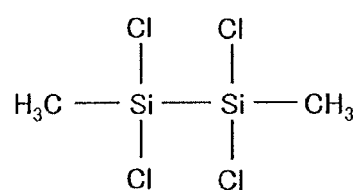
FIG. 10A is a diagram illustrating a chemical structural formula of TCDMDS.
Figure 10B:
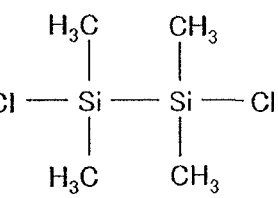
FIG. 10B is a diagram illustrating a chemical structural formula of DCTMDS.
Figure 10C:
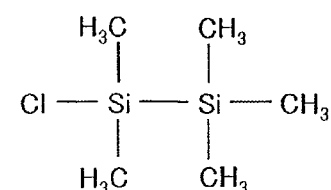
FIG. 10C is a diagram illustrating a chemical structural formula of MCPMDS.

In addition, as the halosilane source gas, for example, a source gas containing Si, Cl, and an alkyl group and having a Si—C bond, that is, an alkyl chlorosilane source gas being an organic chlorosilane source gas may also be used. The alkyl group includes a methyl group, an ethyl group, a propyl group, a butyl group, or the like. The alkyl chlorosilane source gas can also be referred to as an alkyl halosilane source gas. As the alkyl chlorosilane source gas, for example, 1,1,2,2-tetrachloro-1,2-dimethyldisilane (($CH_3)_2Si_2Cl_4$, abbreviated to TCDMDS) gas, 1,2-dichloro-1,1,2,2-tetramethyldisilane (($CH_3)_4Si_2Cl_2$, abbreviated to DCTMDS) gas, 1-monochloro-1,1,2,2,2-pentamethyldisilane (($CH_3)_5Si_2Cl$, abbreviated to MCPMDS) gas, or the like can be used. FIG. 10A illustrates a chemical structural formula of TCDMDS, FIG. 10B illustrates a chemical structural formula of DCTMDS, and FIG. 10C illustrates a chemical structural formula of MCPMDS. It can be said that these gases are a source gas that includes at least two Si per molecule, further includes C and Cl, and has a Si—C bond. These gases further have a Si—Si bond, a Si—Cl bond, or the like. In a film-forming process to be described below, these gases also act as a Si source and also act as a C source.

In addition, as the silane source gas, for example, a source gas containing Si and an amino group (amine group), that is, an aminosilane source gas can be used. The aminosilane source is a silane source having an amino group. Also, the aminosilane source is a silane source having an alkyl group such as a methyl group, an ethyl group, or a butyl group. The aminosilane source is a source containing at least Si, nitrogen (N) and C. That is, it can be said that the aminosilane source mentioned herein is an organic source or an organoaminosilane source.

Figure 11:
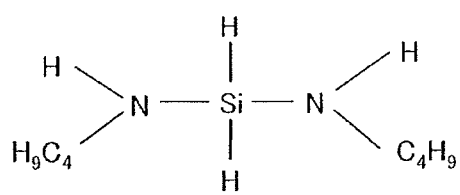
FIG. 11 illustrates a chemical structural formula of BTBAS.

As the aminosilane source gas, for example, bis(tertiarybutylamino)silane ($SiH_2[NH(C_4H_9)]_2$, abbreviated to BTBAS) gas can be used. A chemical structural formula of BTBAS is illustrated in FIG. 11. It can be said that BTBAS is a source gas that includes one Si per molecule, has a Si—N bond, a Si—H bond, an N—C bond, or the like, and does not have a Si—C bond. BTBAS acts as a Si source in a film-forming process to be described below. As the aminosilane source gas, tetrakis(dimethylamino)silane ($Si[N(CH_3)_2]_4$, abbreviated to 4DMAS) gas, tris(dimethylamino)silane ($Si[N(CH_3)_2]_3H$, abbreviated to 3DMAS) gas, bis(diethylamino)silane ($Si[N(C_2H_5)_2]_2H_2$, abbreviated to BDEAS) gas, or the like can be suitably used.

In a case where a liquid source, such as HCDS, BTCSM, TCDMDS, or BTBAS, which is in a liquid state under normal temperature and normal pressure, is used, the source of the liquid state can be vaporized by a vaporization system, such as a vaporizer or a bubbler, and be supplied as the silane source gas (HCDS gas, BTCSM gas, TCDMDS gas, BTBAS gas, or the like).

As a reactant having a different chemical structure (molecular structure) from the source, for example, an oxygen (O)-containing gas is supplied from the gas supply pipe 232b into the process chamber 201 through the MFC 241b, the valve 243b, the nozzle 249b, and the buffer chamber 237.

In a film-forming process to be described below, the O-containing gas acts as an oxidizing agent (oxidizing gas), that is, an O source. As the O-containing gas, for example, water vapor ($H_2O$ gas), oxygen ($O_2$) gas, or the like can be used. In a case where $H_2O$ gas is used as the oxidizing agent, for example, pure water (or ultrapure water) such as reverse osmosis (RO) water from which impurities are removed by using a reverse osmosis membrane, deionized water from which impurities are removed by performing deionization treatment, or distilled water from which impurities are removed by distillation using a distiller is vaporized by a vaporization system such as a vaporizer or a bubbler and is supplied as $H_2O$ gas. In addition, in a case where $O_2$ gas is used as the oxidizing agent, for example, the gas is plasma-excited by using a plasma source to be described below and is supplied as a plasma-excited gas ($O_2$*gas).

In addition, a catalyst for accelerating a deposition reaction by the above-described source or reactant is supplied from the gas supply pipes 232a and 232b into the process chamber 201 through the MFCs 241a and 241b, the valves 243a and 243b, the nozzles 249a and 249b, and the buffer chamber 237. As the catalyst, for example, an amine-based gas containing C, N, and H can be used.

The amine-based gas is a gas containing amine in which at least one H of ammonia ($NH_3$) is substituted with a hydrocarbon group such as an alkyl group. As illustrated in FIGS. 12A to 12F, amine that includes N having a lone electron pair and has an acid dissociation constant (hereinafter also referred to as pKa) of, for example, about 5 to about 11 can be suitably used as the catalyst. The acid dissociation constant (pKa) is a quantitative measure of the strength of an acid, and is represented by a negative common logarithm of an equilibrium constant Ka in a dissociation reaction in which H ions are released from the acid. As the amine-based gas, a cyclic amine-based gas in which a hydrocarbon group is annular, or chain amine-based gas in which a hydrocarbon group is chained can be used.

As the cyclic amine-based gas, as illustrated in FIG. 12A, for example, a pyridine ($C_5H_5N$, pKa=5.67) gas, an aminopyridine ($C_5H_6N_2$, pKa=6.89) gas, a picoline ($C_6H_7N$, pKa=6.07) gas, a lutidine ($C_7H_9N$, pKa=6.96) gas, a piperazine ($C_4H_{10}N_2$, pKa=9.80) gas, a piperidine ($C_5H_{11}N$, pKa=11.12) gas, or the like can be used. It can be said that the cyclic amine-based gas is a heterocyclic compound in which a cyclic structure is composed of a plurality of types of elements of C and N, that is, an N-containing heterocyclic compound.

As the chain amine-based gas, as illustrated in FIGS. 12B to 12F, for example, a triethylamine (($C_2H_5)_3N$, abbreviated to TEA, pKa=10.7) gas, a diethylamine (($C_2H_5)_2NH$, abbreviated to DEA, pKa=10.9) gas, a monoethylamine (($C_2H_5$)$NH_2$, abbreviated to MEA, pKa=10.6) gas, a trimethylamine (($CH_3)_3N$, abbreviated to TMA, pKa=9.8) gas, a monomethylamine (($CH_3)NH_2$, abbreviated to MMA, pKa=10.6) gas, or the like can be used.

The amine-based gas acting as the catalyst can also be referred to as an amine-based catalyst or an amine-based catalyst gas. As the catalyst gas, besides the above-mentioned amine-based gas, a non-amine-based gas, for example, ammonia ($NH_3$, pKa=9.2) gas, can also be used.

In some cases, a molecular structure of the above-mentioned catalyst may be partially decomposed in a film-forming process to be described below. As such, a material that partially changes before and after a chemical reaction is not strictly a "catalyst". However, in the present disclosure, even in a case where a material is partially decomposed in the process of a chemical reaction, a material that is not mostly decomposed and substantially acts as a catalyst by changing a reaction rate is referred to as a "catalyst".

As the inert gas, for example, nitrogen ($N_2$) gas is supplied from the gas supply pipes 232c and 232d into the process chamber 201 through the MFCs 241c and 241d, the valves 243c and 243d, the gas supply pipes 232a and 232b, the nozzles 249a and 249b, and the buffer chamber 237.

In a film-forming process to be described below, in a case where the above-mentioned source is supplied from the gas supply pipe 232a, a source supply system serving as a first supply system is configured by, mainly, the gas supply pipe 232a, the MFC 241a, and the valve 243a. The nozzle 249a may be included in the source supply system. The source supply system can also be referred to as a source gas supply system. In a case where the halosilane source is supplied from the gas supply pipe 232a, the source supply system can also be referred to as a halosilane source supply system or a halosilane source gas supply system. In addition, in a case where the aminosilane source is supplied from the gas supply pipe 232a, the source supply system can also be referred to as an aminosilane source supply system or an aminosilane source gas supply system.

In addition, in a film-forming process to be described below, in a case where the above-mentioned reactant is supplied from the gas supply pipe 232b, a reactant supply system serving as a second supply system is configured by, mainly, the gas supply pipe 232b, the MFC 241b, and the valve 243b. The nozzle 249b and the buffer chamber 237 may be included in the reactant supply system. The reactant supply system can also be referred to as a reactant gas supply system. In a case where an oxidizing agent is supplied from the gas supply pipe 232b, the reactant supply system can also be referred to as an oxidizing agent supply system, an oxidizing gas supply system, or an O-containing gas supply system.

In addition, in a film-forming process to be described below, in a case where the above-mentioned catalyst is supplied from the gas supply pipes 232a and 232b, a catalyst supply system serving as a third supply system is configured by, mainly, the gas supply pipes 232a and 232b, the MFCs 241a and 241b, and the valves 243a and 243b. The nozzles 249a and 249b and the buffer chamber 237 may be included in the catalyst supply system. The catalyst supply system can also be referred to as a catalyst gas supply system. In a case where an amine-based gas is supplied from the gas supply pipes 232a and 232b, the catalyst supply system can also be referred to as an amine-based catalyst supply system, an amine supply system, or an amine-based gas supply system.

In addition, an inert gas supply system is configured by, mainly, the gas supply pipes 232c and 232d, the MFCs 241c and 241d, and the valves 243c and 243d.

Figure 2:
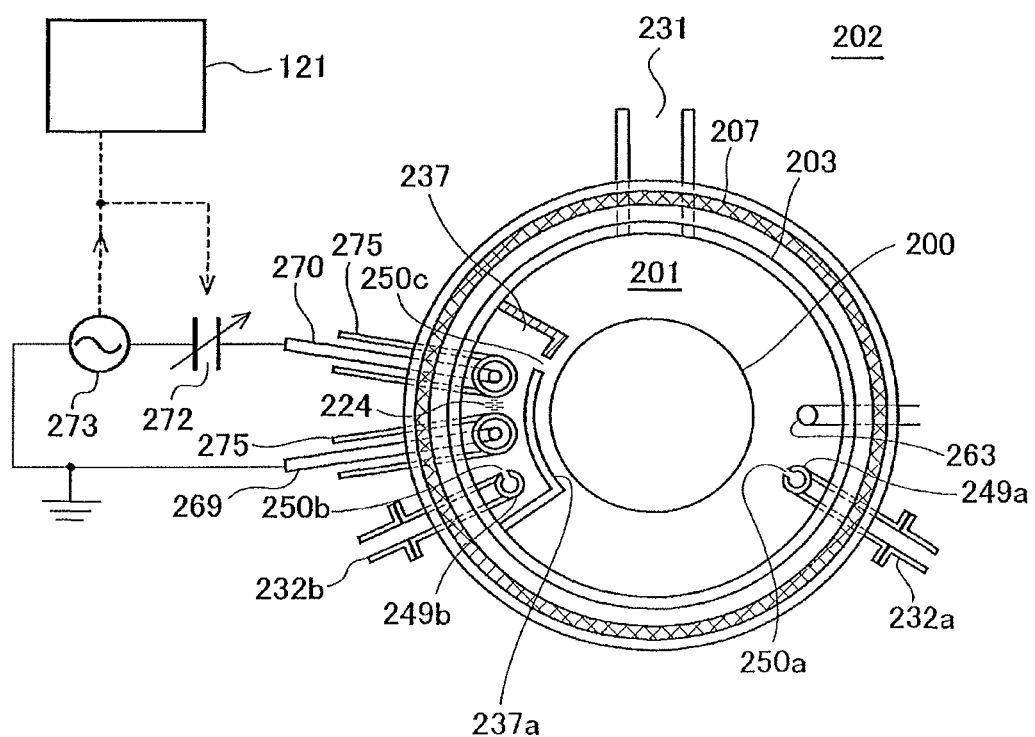
FIG. 2 is a schematic configuration diagram of the vertical process furnace of the substrate processing apparatus suitably used in the embodiment and a sectional view of the process furnace part, taken along line A-A of FIG. 1.

In the buffer chamber 237, as illustrated in FIG. 2, two rod-shaped electrodes 269 and 270, each of which is made of a conductor and has an elongated structure, are disposed from the lower part to the upper side of the reaction tube 203 in a stacking direction of the wafers 200. Each of the rod-shaped electrodes 269 and 270 is provided in parallel to the nozzle 249b. The rod-shaped electrodes 269 and 270 are respectively covered with and protected by electrode protection pipes 275 from the upper side to the lower side thereof. One of the rod-shaped electrodes 269 and 270 is connected to a radio frequency (RF) power source 273 through a matcher 272, and the other thereof is connected to an earth which is a reference potential. By applying RF power from the RF power source 273 between the rod-shaped electrodes 269 and 270, plasma is generated in a plasma generation region 224 between the rod-shaped electrodes 269 and 270. A plasma source serving as a plasma generator (plasma generation section) is configured by, mainly, the rod-shaped electrodes 269 and 270 and the electrode protection pipes 275. The matcher 272 and the RF power source 273 may be included in the plasma source. The plasma source functions as a plasma excitation section (activation mechanism) configured to excite a gas to generate plasma, that is, to excite (activate) a gas to a plasma state as described later.

The electrode protection pipes 275 are configured such that each of the rod-shaped electrodes 269 and 270 can be inserted into the buffer chamber 237 in a state of being isolated from an atmosphere of the buffer chamber 237. When an O concentration inside the electrode protection pipe 275 is approximately equal to an O concentration in the outside air (atmosphere), the rod-shaped electrodes 269 and 270 respectively inserted into the electrode protection pipes 275 are oxidized by heat generated by the heater 207. The insides of the electrode protection pipes 275 are filled with an inert gas, such as N2 gas, or are purged with an inert gas, such as N2 gas, by using an inert gas purge mechanism so that the O concentration inside the electrode protection pipes 275 can be reduced to thereby prevent the oxidation of the rod-shaped electrodes 269 and 270.

An exhaust pipe 231 is provided in the reaction tube 203 so as to exhaust the atmosphere of the process chamber 201. In the exhaust pipe 231, a vacuum pump 246 serving as a vacuum exhaust device is connected through a pressure sensor 245 serving as a pressure detector (pressure detection section), which detects a pressure in the process chamber 201, and an auto pressure controller (APC) valve 244 serving as an exhaust valve (pressure regulation section). The APC valve 244 is a valve configured to perform a vacuum exhaust or a vacuum exhaust stop with respect to the process chamber 201 by opening and closing the valve while the vacuum pump 246 is operating, and to regulate the pressure in the process chamber 201 by adjusting the degree of valve opening based on pressure information detected by the pressure sensor 245 while the vacuum pump 246 is operating. An exhaust system is configured by, mainly, the exhaust pipe 231, the APC valve 244, and the pressure sensor 245. The vacuum pump 246 may be included in the exhaust system. The exhaust pipe 231 is not limited to the installation in the reaction tube 203. Similar to the nozzles 249a and 249b, the exhaust pipe 231 may be provided in the manifold 209.

Under the manifold 209, a seal cap 219 is provided as a furnace throat lid that can airtightly close a lower end opening of the manifold 209. The seal cap 219 is configured to abut against a lower end of the manifold 209 from a lower side in a vertical direction. The seal cap 219 is made of a metal such as stainless steel (SUS) and is formed to have a disk shape. On the top surface of the seal cap 219, an O-ring 220b is provided as a seal member that abuts against the lower end of the manifold 209. A rotation mechanism 267 that rotates the boat 217 to be described below is installed at a side of the seal cap 219 opposite to the process chamber 201. A rotational shaft 255 of the rotation mechanism 267 passes through the seal cap 219 and is connected to the boat 217. The rotation mechanism 267 is configured to rotate the wafers 200 by rotating the boat 217. The seal cap 219 is configured such that the seal cap 219 is moved upward and downward by a boat elevator 115 serving as an elevation mechanism that is vertically installed outside the reaction tube 203. The boat elevator 115 is configured to load the boat 217 into the process chamber 201 or unload the boat 217 from the process chamber 201 by moving the seal cap 219 upward or downward. The boat elevator 115 is configured as a transfer device (transfer mechanism) that transfers the boat 217, that is, the wafers 200, to the inside or the outside of the process chamber 201. In addition, under the manifold 209, a shutter 219s is provided as a furnace throat lid that can airtightly close the lower end opening of the manifold 209 while the seal cap 219 is moved downward by the boat elevator 115. The shutter 219s is made of a metal such as stainless steel (SUS) and is formed to have a disk shape. On the top surface of the shutter 219s, an O-ring 220c is provided as a seal member that abuts against the lower end of the manifold 209. The opening/closing operation (the upward/downward moving operation, the rotating operation, or the like) of the shutter 219s is controlled by a shutter opening/closing mechanism 115s.

The boat 217 serving as a substrate supporter is configured such that a plurality of sheets of wafers 200, for example, 25 to 200 wafers, are vertically aligned and supported in a horizontal posture, with their centers aligned with one another, in multiple stages, that is, arranged spaced apart from one another. The boat 217 is made of, for example, a heat resistant material such as quartz or SiC. Below the boat 217, a heat insulation plate 218 made of, for example, a heat resistant material such as quartz or SiC, is configured to be supported in multiple stages. Due to this configuration, heat generated from the heater 207 is hardly transmitted toward the seal cap 219. However, the present embodiment is not limited to the above example. For example, instead of providing the heat insulation plate 218 below the boat 217, a heat insulation cylinder configured as a cylindrical member made of a heat resistant material such as quart or SiC may be provided.

A temperature sensor 263 serving as a temperature detector is installed in the reaction tube 203. An amount of current to be supplied to the heater 207 is adjusted based on temperature information detected by the temperature sensor 263, so that the temperature in the process chamber 201 has a desired temperature distribution. The temperature sensor 263 is configured to have an L shape similar to the nozzles 249a and 249b and is provided along the inner wall of the reaction tube 203.

Figure 3:
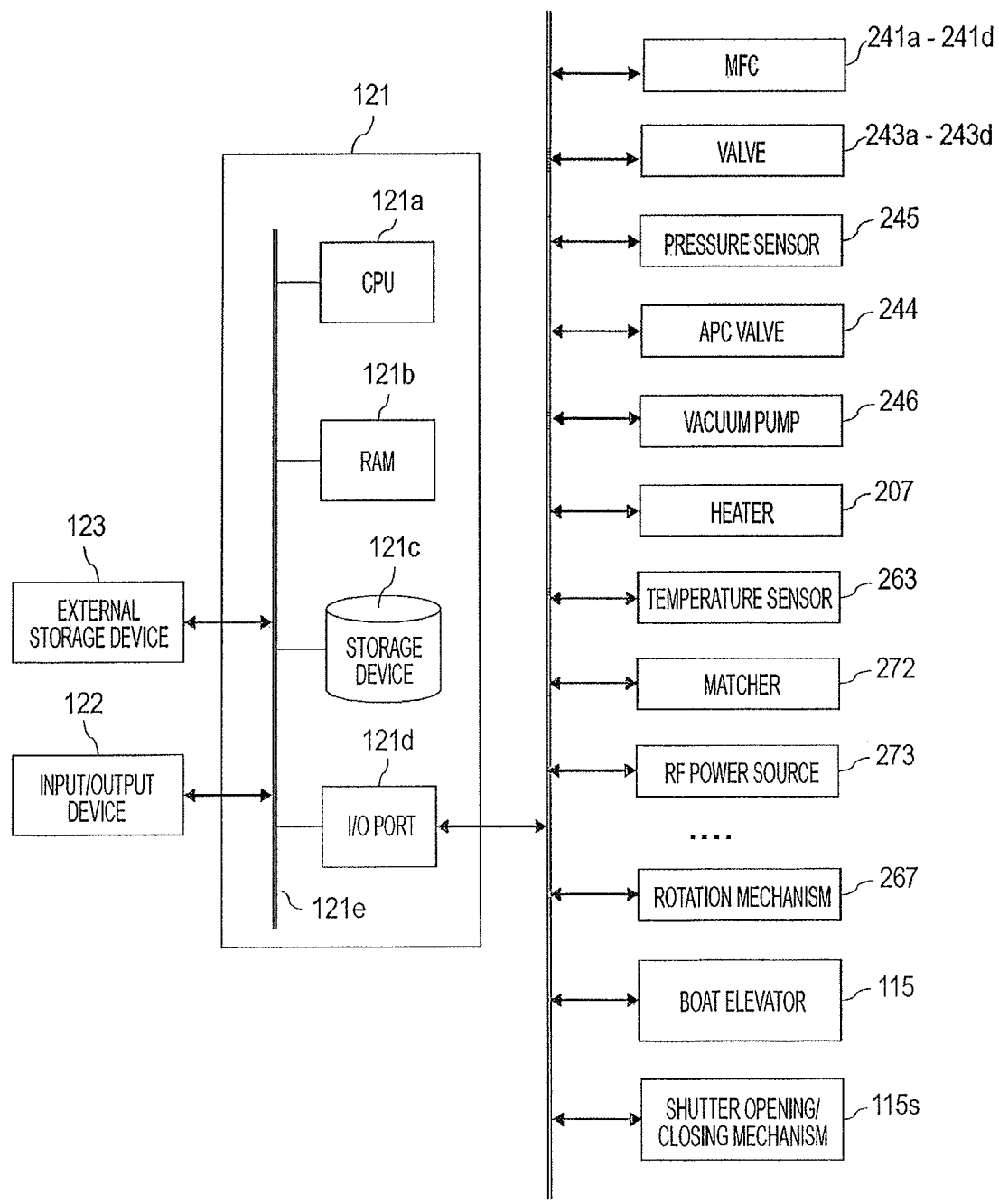
FIG. 3 is a schematic configuration diagram of a controller of the substrate processing apparatus suitably used in the embodiment and a block diagram of a control system of the controller.

As illustrated in FIG. 3, a controller 121 being a control unit (control device) is configured by a computer that includes a central processing unit (CPU) 121a, random access memory (RAM) 121b, a memory device 121c, and an input/output (I/O) port 121d. The RAM 121b, the memory device 121c, and the I/O port 121d are configured to exchange data with the CPU 121a through an internal bus 121e. An I/O device 122, which is configured as, for example, a touch panel or the like, is connected to the controller 121.

The memory device 121c is configured by, for example, flash memory or a hard disk drive (HDD). In the memory device 121c, a control program for controlling an operation of a substrate processing apparatus or a process recipe including procedures or conditions of a film-forming process to be described below is stored to be readable. The process recipe is a combination of sequences of a film-forming process to be described below so as to obtain a desired result when the procedures are performed by the controller 121, and functions as a program. Hereinafter, the process recipe, the control program, and the like will be simply and collectively referred to as a program. In addition, the process recipe is simply referred to as a recipe. When the term "program" is used in the present disclosure, it may be understood as including only a recipe alone, only a control program alone, or both of the recipe and the control program. The RAM 121b is configured as a memory area (work area) in which a program or data read by the CPU 121a is temporarily retained.

The I/O port 121d is connected to the MFCs 241a to 241d, the valves 243a to 243d, the pressure sensor 245, the APC valve 244, the vacuum pump 246, the temperature sensor 263, the heater 207, the rotation mechanism 267, the boat elevator 115, the shutter opening/closing mechanism 115s, the matcher 272, the RF power source 273, and the like.

The CPU 121a is configured to read and execute the control program from the memory device 121c and to read the recipe from the memory device 121c according to an input of an operation command received from the I/O device 122, or the like. According to the contents of the read recipe, the CPU 121a is configured to control the operation of adjusting the flow rates of various gases by using the MFCs 241a to 241d, the operation of opening/closing the valves 243a to 243d, the operation of opening/closing the APC valve 244, the operation of adjusting the pressure by using the APC valve 244 based on the pressure sensor 245, the operation of driving and stopping the vacuum pump 246, the operation of adjusting the temperature of the heater 207 based on the temperature sensor 263, the operation of rotating the boat 217 and adjusting the rotating speed of the boat 217 by using the rotation mechanism 267, the operation of moving the boat 217 upward or downward by using the boat elevator 115, the operation of opening and closing the shutter 219s by using the shutter opening/closing mechanism 115s, the operation of adjusting impedance by using the matcher 272, the operation of controlling the supply of power by using the RF power source 273, and the like.

The controller 121 can be configured by installing, on a computer, the program stored in an external memory device (for example, a magnetic tape, a magnetic disk such as a flexible disk or a hard disk, an optical disk such as a CD or a DVD, a magneto-optical disk such as an MO, or a semiconductor memory such as a USB or a memory card) 123. The memory device 121c or the external memory device 123 is configured as a non-transitory computer-readable recording medium. Hereinafter, the memory device 121c and the external memory device 123 may also be simply and collectively referred to as a recording medium. When the term "recording medium" is used in the present disclosure, it may be understood as including only the memory device 121c alone, only the external memory device 123 alone, or both of the memory device 121c and the external memory device 123. The provision of the program to the computer may be performed by using a communication means such as the Internet or dedicated line, without using the external memory device 123.

(2) Substrate Processing

An example of a sequence of forming a film where a first layer and a second layer are laminated on a substrate by using the above-described substrate processing apparatus will be described with reference to FIG. 4 as one of the processes of manufacturing a semiconductor device (de-vice). In the following description, operations of the respective elements constituting the substrate processing apparatus are controlled by the controller 121.

Figure 4:
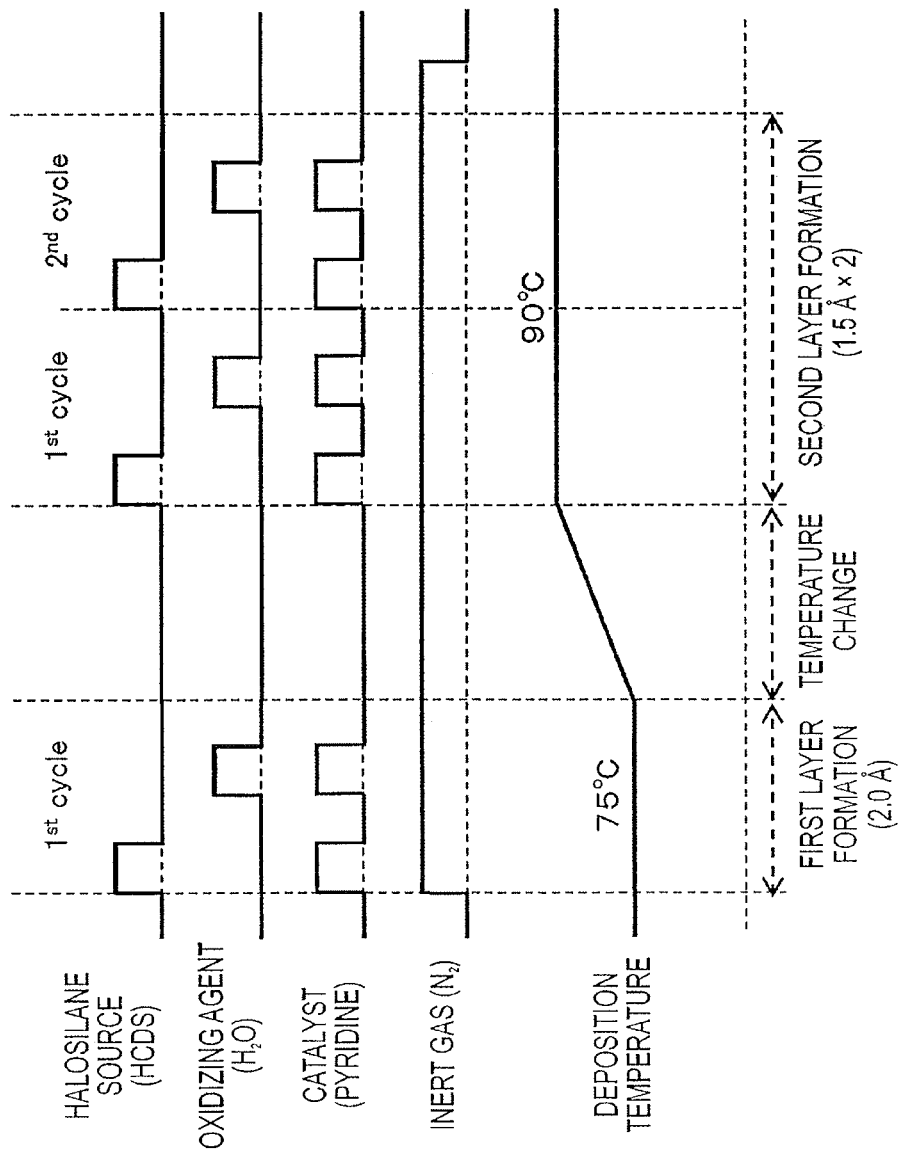
FIG. 4 is a diagram illustrating a film-forming sequence according to an embodiment.

In the film-forming sequence illustrated in FIG. 4, a silicon oxide film (SiO film) containing Si and O is formed as a film where a first layer and a second layer are laminated on a wafer 200 by performing: forming a silicon oxide layer (SiO layer) including Si and O as the first layer by performing a first cycle a predetermined number of times (m times), the first cycle including non-simultaneously performing: supplying an HCDS gas to the wafer 200 as a substrate, and supplying the $H_2O$ gas to the wafer 200, under a first temperature at which neither the HCDS gas nor the $H_2O$ gas is thermally decomposed when the HCDS gas as a source and the $H_2O$ gas as a reactant are present alone, respectively; and forming a silicon oxide layer (SiO layer) including Si and O as the second layer by performing a second cycle a predetermined number of times (n times), the second cycle including non-simultaneously performing: supplying the HCDS gas to the wafer 200, and supplying the $H_2O$ gas to the wafer 200, under a second temperature at which neither the HCDS gas nor the $H_2O$ gas is thermally decomposed when the HCDS gas and the $H_2O$ gas are present alone, respectively, the second temperature being different from the first temperature.

In the above, each of m and n is an integer equal to or greater than 1. The film-forming sequence illustrated in FIG. 4 shows an example of performing the first cycle once (m=1) in the forming of the first layer and performing the second cycle twice (n=2) in the forming of the second layer.

In addition, the film-forming sequence illustrated in FIG. 4 shows an example in which each of the forming of the first layer and the forming of the second layer includes supplying a pyridine gas as a catalyst to the wafer 200. Specifically, an example in which each of the first cycle and the second cycle includes performing non-simultaneously: supplying the HCDS gas and the pyridine gas to the wafer 200 and supplying the $H_2O$ gas and the pyridine gas to the wafer 200 is shown.

In addition, the film-forming sequence illustrated in FIG. 4 shows an example in which the temperature of the wafer 200 is changed from the first temperature to the second temperature between the forming of the first layer and the forming of the second layer.

In the present disclosure, for convenience, the film-forming sequence illustrated in FIG. 4 may be represented as follows. In the following descriptions of modification examples or other embodiments, the same notation will be used.

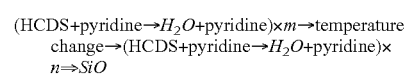

(HCDS+pyridine→$H_2O$+pyridine)×m→temperature change→(HCDS+pyridine→$H_2O$+pyridine)× n⇒SiO When the term "wafer" is used in the present disclosure, it may be understood as a wafer itself or a laminate (aggregate) of a wafer and a predetermined layer or film formed on a surface thereof, that is, a wafer including a predetermined layer or film formed on a surface thereof. In addition, when the expression "a surface of a wafer" is used in the present disclosure, it may be understood as "a surface (exposed surface) of a wafer itself" or "a surface of a predetermined layer or film formed on a wafer, that is, an uppermost surface of a wafer as a laminate".

Thus, in the present disclosure, the expression "a predetermined gas is supplied to a wafer" may be understood to mean that "the predetermined gas is directly supplied to a surface (exposed surface) of a wafer itself" or that "the predetermined gas is supplied to a layer or film formed on a wafer, that is, an uppermost surface of a wafer as a laminate". In addition, in the present disclosure, the expression "a predetermined layer (or film) is formed on a wafer" may be understood to mean that "a predetermined layer (or film) is directly formed on a surface (exposed surface) of a wafer itself" or mean that "a predetermined layer (or film) is formed on a layer or film formed on a wafer, that is, an uppermost surface of a wafer as a laminate".

In addition, a case where the term "substrate" is used in the present disclosure is the same as the case where the term "wafer" is used.

(Loading)

When a plurality of sheets of wafers 200 are charged into the boat 217 (wafer charging), the shutter 219s is moved by the shutter opening/closing mechanism 115s and the lower end opening of the manifold 209 is opened (shutter opening). After that, as illustrated in FIG. 1, the boat 217 that supports the plurality of sheets of wafers 200 is lifted by the boat elevator 115 and is loaded into the process chamber 201 (boat loading). In this state, the seal cap 219 is in a state of sealing the lower end of the manifold 209 through the O-ring 220b.

(Pressure and Temperature Adjustment)

The inside of the process chamber 201, that is, the space where the wafers 200 are present, is vacuum-exhausted (evacuated) to have a desired pressure (degree of vacuum) by the vacuum pump 246. In this case, the pressure in the process chamber 201 is measured by the pressure sensor 245, and the APC valve 244 is feedback-controlled based on information about the measured pressure. The vacuum pump 246 maintains a full-time operating state at least until the processing on the wafers 200 is completed. In addition, the wafers 200 in the process chamber 201 are heated by the heater 207 until the wafers 200 have a desired temperature (first temperature to be described below). In this case, an amount of current supplied to the heater 207 is feedback-controlled based on the temperature information detected by the temperature sensor 263, so that the inside of the process chamber 201 has a desired temperature distribution. The heating of the inside of the process chamber 201 by the heater 207 is continuously performed at least until the processing on the wafers 200 is completed. In addition, the rotation of the boat 217 and the wafers 200 is started by the rotation mechanism 267. The rotation of the boat 217 and the wafers 200 by the rotation mechanism 267 is continuously performed at least until the processing on the wafers 200 is completed.

(Forming of First Layer)

After that, the following two steps, that is, steps 1a and 1b, are sequentially performed.

[Step 1a]

In this step, the HCDS gas and the pyridine gas are supplied to the wafers 200 in the process chamber 201.

The valves 243a and 243b are opened, so that the HCDS gas flows into the gas supply pipe 232a and the pyridine gas flows into the gas supply pipe 232b. The HCDS gas and the pyridine gas, of which the flow rates are respectively controlled by the MFCs 241a and 241b, are supplied into the process chamber 201 through the nozzles 249a and 249b and the buffer chamber 237. After the HCDS gas and the pyridine gas are supplied into the process chamber 201, the HCDS gas and the pyridine gas are mixed (post-mixed) with each other and are exhausted from the exhaust pipe 231. At this time, the valves 243c and 243d are opened at the same time, and N2 gas flows into the gas supply pipes 232c and 232d. The flow rates of the N2 gases, which flow into the gas supply pipes 232c and 232d, are respectively adjusted by the MFCs 241c and 241d, are supplied into the process chamber 201 together with the HCDS gas and the pyridine gas, and are exhausted from the exhaust pipe 231.

At this time, the APC valve 244 is appropriately adjusted such that the pressure in the process chamber 201 is set to a pressure within a range of, for example, 1 Pa to 3,000 Pa, and preferably 133 Pa to 2,666 Pa. The supply flow rate of the HCDS gas, which is controlled by the MFC 241a, is set to a flow rate within a range of, for example, 1 sccm to 2,000 sccm, and preferably 10 sccm to 1,000 sccm. The supply flow rate of the pyridine gas, which is controlled by the MFC 241b, is set to a flow rate within a range of, for example, 1 sccm to 2,000 sccm, and preferably 10 sccm to 1,000 sccm. The supply flow rates of the N2 gases, which are controlled by the MFCs 241c and 241d, are respectively set to a flow rate within a range of, for example, 100 sccm to 10,000 sccm. The time to supply the HCDS gas and the pyridine to the wafer 200, that is, the gas supply time (irradiation time), is set to a time within a range of, for example, 1 second to 100 seconds, and preferably 5 seconds to 60 seconds.

At this time, the temperature of the heater 207 is set such that the temperature of the process chamber 201 is set to be a temperature (first temperature) within a range of, for example, 0° C. to 150° C., preferably room temperature (25° C.) to 100° C., and more preferably 40° C. to 90° C. This temperature zone is a temperature at which neither the HCDS gas nor the $H_2O$ gas is thermally decomposed when the HCDS gas and the $H_2O$ gas are present alone, respectively, in the process chamber 201.

In a case where the pyridine gas is not supplied at the time of supplying the HCDS gas, if the temperature of the wafer 200 is less than 350° C., the HCDS is not chemisorbed on the wafer 200, and thus, a practical deposition rate may not be obtained. By supplying the pyridine gas together with the HCDS gas, a sufficient amount of HCDS is chemisorbed on the wafer 200 even when the temperature of the wafer 200 is lower than 150° C., thereby obtaining a practical deposition rate. By lowering the temperature of the wafer 200 to 100° C. or less and further 90° C. or less in the presence of the pyridine gas, it is possible to reduce an amount of heat applied to the wafer 200 and to satisfactorily perform the control of heat history experienced on the wafer 200. When the temperature of the wafer 200 is 0° C. or more in the presence of the pyridine gas, the HCDS can be chemisorbed on the wafer 200, and thus, the film-forming process can be progressed.

In order to lower the temperature of the wafer 200 to below 0° C., it is necessary to install a large-scale cooling mechanism for cooling the process chamber 201 to this temperature, thus causing an increase in a manufacturing cost of the substrate processing apparatus, the complexity of temperature control, and the like. This can be solved by increasing the temperature of the wafer 200 to 0° C. or more. Since the temperature of the wafer 200 is set to be room temperature or more, and preferably 40° C. or more, it is unnecessary to install a cooling mechanism for cooling the process chamber 201, thus reducing a manufacturing cost of the substrate processing apparatus and simplifying the temperature control.

Therefore, it is preferable that the temperature of the wafer 200 is set to be a temperature within a range of 0° C. to 150° C., preferably 100° C. or less, and more preferably 40° C. to 90° C. In the present embodiment, the temperature (first temperature) of the wafer 200 is set to be 75° C. as an example.

By supplying the HCDS gas to the wafer 200 under the above-described condition, a Si-containing layer including Cl is formed on the wafer 200 (base film of the surface of the wafer 200) to a thickness of, for example, less than one atomic layer to a several-atomic layer. The Si-containing layer including Cl may be a Si layer including Cl, may be an adsorption layer of the HCDS, or may include both of them. In the present disclosure, for convenience, the Si-containing layer including Cl is simply referred to as a Si-containing layer.

The Si layer containing Cl is a generic term including not only a continuous layer configured by Si and including Cl but also a discontinuous layer, or a Si thin film including Cl overlapping them. The continuous layer including Cl, which is configured by Si, may be a Si thin film including Cl. Si constituting the Si layer including Cl includes a case where bonding with Cl is completely cut.

The adsorption layer of the HCDS includes not only a continuous adsorption layer configured by HCDS molecules but also a discontinuous adsorption layer. That is, the adsorption layer of the HCDS includes an adsorption layer having a thickness of one molecular layer configured by HCDS molecules or an adsorption layer having a thickness of less than one molecular layer. The HCDS molecules constituting the adsorption layer of the HCDS include a molecule represented by a chemical structural formula of FIG. 8A and a molecule in which bonding with Si and Cl is partially cut. That is, the adsorption layer of the HCDS may be a physical adsorption layer of the HCDS, may be a chemical adsorption layer of the HCDS, or may include both of them.

Here, the layer having the thickness of less than one atomic layer means an atomic layer that is discontinuously formed, and the layer having the thickness of one atomic layer means an atomic layer that is continuously formed. The layer having the thickness of less than one molecular layer means a molecular layer that is discontinuously formed, and the layer having the thickness of one molecular layer means a molecular layer that is continuously formed. The Si-containing layer may include both the Si layer including Cl and the adsorption layer of the HCDS. However, as described above, the Si-containing layer including Cl may be referred to as "one atomic layer", "several-atomic layer", or the like.

When the thickness of the Si-containing layer formed on the wafer 200 exceeds the several-atomic layer, the oxidation action in step 1b to be described below does not reach the whole Si-containing layer. In addition, a minimum value of the thickness of the Si-containing layer, which can be formed on the wafer 200, is less than one atomic layer. Therefore, it is preferable that the thickness of the Si-containing layer is set to be less than one atomic layer to the several-atomic layer. When the thickness of the Si-containing layer is set to one atomic layer or less, that is, one atomic layer or less than one atomic layer, the oxidation action in step 1b to be described below can be relatively increased, and the time necessary for the oxidation in step 1b can be reduced. The time necessary for forming the Si-containing layer in step 1a can be reduced. As a result, the processing time per a cycle can be reduced and the total processing time can be reduced. That is, the deposition rate can be increased. In addition, when the thickness of the Si-containing layer is set to one atomic layer or less, the controllability of the film thickness uniformity can be increased.

Under a condition that the HCDS gas is self-decomposed (thermally decomposed), that is, under a condition that a thermal decomposition reaction of the HCDS occurs, Si is deposited on the wafer 200 to form a Si layer including Cl. Under a condition that the HCDS gas is not self-decomposed (thermally decomposed), that is, under a condition that a thermal decomposition reaction of the HCDS does not occur, HCDS is deposited on the wafer 200 to form an adsorption layer of the HCDS. As compared with the formation of the adsorption layer of the HCDS on the wafer 200, the formation of the Si layer including Cl on the wafer 200 is preferable because the deposition rate can be increased. However, in the present embodiment, since the temperature of the wafer 200 is set to be a low temperature, for example, 150° C. or less, the adsorption layer of the HCDS is more easily formed on the wafer 200 than the Si layer including Cl. In a case where the pyridine gas is not supplied together with the HCDS gas, the adsorption layer of the HCDS is more easily configured by the physical adsorption layer of the HCDS than the chemical adsorption layer of the HCDS.

The pyridine gas acts as a catalyst gas (first catalyst gas) that weakens the binding force of the O—H bond present on the surface of the wafer 200, accelerates the desorption of Cl from the HCDS molecules, and accelerates the formation of the Si-containing layer by the chemical adsorption of the HCDS molecules. For example, the pyridine gas acts on the O—H bond present on the surface of the wafer 200 and acts to weaken the O—H bond. Due to the reaction between H having a weakened binding force and Cl of the HCDS gas, a gaseous material including Cl and H is generated, H is desorbed from the surface of the wafer 200, and Cl is desorbed from the HCDS molecules. Since the HCDS molecules (halide), from which Cl is lost, is chemisorbed on the surface of the wafer 200 or the like. Therefore, the chemical adsorption layer of the HCDS is formed on the wafer 200.

Due to the catalyst action of the pyridine gas, the binding force of the O—H bond present on the surface of the wafer 200 is weakened because N having a lone electron pair in the pyridine molecule acts to attract H. A compound having large pKa has a strong force to attract H. When a compound having pKa of 5 or more is used as a catalyst gas, the compound can accelerate the desorption of Cl from the HCDS molecule and can accelerate the formation of the Si-containing layer due to the chemical adsorption. However, when a compound having excessively large pKa is used as a catalyst gas, Cl released from the HCDS molecule reacts with the catalyst gas. Thus, a salt (particle source) such as ammonium chloride ($NH_4Cl$) may be generated. Therefore, a compound having pKa of, for example, 11 or less, and preferably 7 or less, is suitably used as the catalyst gas. The pyridine gas has relatively large pKa of about 5.67, and the pyridine gas having pKa of 7 or more can be suitably used as the catalyst gas.

After the Si-containing layer is formed, the valves 243a and 243b are closed, and the supply of the HCDS gas and the pyridine gas into the process chamber 201 is stopped. At this time, the APC valve 244 is maintained in the opened state, and the inside of the process chamber 201 is vacuum-exhausted by the vacuum pump 246. The unreacted HCDS gas and pyridine gas remaining in the process chamber 201, the HCDS gas and pyridine gas after contributing to the formation of the Si-containing layer, the reaction by-product, and the like are removed from the process chamber 201. In addition, the valves 243c and 243d are maintained in the opened state, and the supply of the N2 gas into the process chamber 201 is maintained. The N2 gas acts as a purge gas. This can increase the effect that the unreacted gases remaining in the process chamber 201 or the gases after contributing to the formation of the Si-containing layer are removed from the process chamber 201.

At this time, the gases remaining in the process chamber 201 may not be completely removed, and the inside of the process chamber 201 may not be completely purged. When the amount of the gases remaining in the process chamber 201 is small, an adverse effect does not occur in step 1b that is subsequently performed. At this time, the flow rate of the N2 gas to be supplied into the process chamber 201 also need not be large. For example, by supplying substantially the same amount as the volume of the reaction tube 203 (process chamber 201), the purge can be performed to the extent that an adverse effect does not occur in step 1b. In this way, by not completely purging the inside of the process chamber 201, the purge time can be reduced and the throughput can be improved. In addition, it is possible to minimize the consumption of the N2 gas.

In addition to the HCDS gas, for example, an inorganic halosilane source gas such as an OCTS gas can be used as the source. In addition, an organic halosilane source gas such as a BTCSE gas, a BTCSM gas, a TCDMDS gas, a DCTMDS gas, or an MCPMDS can be used as the source. In addition, an aminosilane source gas such as a BTBAS gas, a 4DMAS gas, a 3DMAS gas, or a BDEAS gas can be used as the source.

In addition to the pyridine gas, for example, a cyclic amine-based gas such as an aminopyridine gas, a picoline gas, a lutidine gas, a piperazine gas, or a piperidine gas, a chain amine-based gas such as a TEA gas, a DEA gas, an MEA gas, a TMA gas, or an MMA gas, or a non-amine-based gas such as an $NH_3$ gas can be used as the catalyst (first catalyst gas).

In addition to the N2 gas, a rare gas such as an Ar gas, a He gas, a Ne gas, or a Xe gas can also be used as the inert gas.

[Step 1b]

After the Si-containing layer is formed on the wafer 200, an $H_2O$ gas and a pyridine gas are supplied to the wafer 200 in the process chamber 201.

In this step, the opening/closing control of the valves 243a to 243d are performed in the same procedures as the opening/closing control of the valves 243a to 243d in step 1a. The $H_2O$ gas and the pyridine gas, of which the flow rates are respectively controlled by the MFCs 241b and 241a, are supplied into the process chamber 201 through the nozzles 249b and 249a and the buffer chamber 237. After the $H_2O$ gas and the pyridine gas are supplied into the process chamber 201, the $H_2O$ gas and the pyridine gas are mixed (post-mixed) with each other and are exhausted from the exhaust pipe 231.

At this time, the supply flow rate of the $H_2O$ gas, which is controlled by the MFC 241b, is set to a flow rate within a range of, for example, 10 sccm to 10,000 sccm, and preferably 100 sccm to 1,000 sccm. The supply flow rate of the pyridine gas, which is controlled by the MFC 241a, is set to a flow rate within a range of, for example, 1 sccm to 2,000 sccm, and preferably 10 sccm to 1,000 sccm. The time to supply the $H_2O$ gas and the pyridine to the wafer 200, that is, the gas supply time (irradiation time), is set to a time within a range of, for example, 1 second to 100 seconds, and preferably 5 seconds to 60 seconds. The other process conditions are, for example, the same as the process conditions in step 1a. Incidentally, the amount of the pyridine gas supplied in step 1b and the amount of the pyridine gas supplied in step 1a can be independently adjusted. For example, the amounts of the pyridine gases supplied in steps 1a and 1b may be equal to or different from each other.

By supplying the $H_2O$ gas to the wafer 200 under the above-described condition, at least a part of the Si-containing layer (Si-containing layer including Cl), which is formed on the wafer 200 in step 1a, is oxidized (modified). Due to the modifying of the Si-containing layer, a layer including Si and O, that is, a silicon oxide layer (SiO layer), is formed. When the SiO layer is formed, impurities such as Cl included in the Si-containing layer constitutes a gaseous material including at least Cl in the process of the modifying reaction by the $H_2O$ gas and is exhausted from the process chamber 201. That is, impurity such as Cl included in the Si-containing layer is released or desorbed from the Si-containing layer and is separated from the Si-containing layer. In this way, the SiO layer formed in step 1b is a layer that has less impurities such as Cl, as compared with the Si-containing layer formed in step 1a.

The pyridine gas acts as a catalyst gas (second catalyst gas) that weakens the binding force of the O—H bond which the $H_2O$ gas has, accelerates the decomposition of the $H_2O$ gas, and accelerates the formation of the SiO layer by the reaction between the $H_2O$ gas and the Si-containing layer. For example, the pyridine gas acts on the O—H bond which the $H_2O$ gas has and acts to weaken the O—H bond. Due to the reaction between H having a weakened binding force and Cl of the Si-containing layer formed on the wafer 200, a gaseous material including Cl and H, such as HCl, is generated, H is desorbed from the $H_2O$ molecule, and Cl is desorbed from the Si-containing layer. O of the $H_2O$ gas from which H is lost is bonded to Si of the Si-containing layer from which Cl is desorbed. Therefore, the oxidized Si-containing layer, that is, the SiO layer, is formed on the wafer 200.

Due to the catalyst action of the pyridine gas, the binding force of the O—H bond which the $H_2O$ gas has is weakened because N having the lone electron pair in the pyridine molecule acts to attract H. As described above, a compound having large pKa has a strong force to attract H. When a compound having pKa of 5 or more is used as a catalyst gas, the compound can appropriately weaken the binding force of the O—H bond which the $H_2O$ gas has and can accelerate the above-described oxidation reaction. However, when a compound having excessively large pKa is used as a catalyst gas, Cl released from the Si-containing layer reacts with the catalyst gas. Thus, a salt such as $NH_4Cl$ may be generated. Therefore, a compound having pKa of, for example, 11 or less, and preferably 7 or less, is suitably used as the catalyst gas. The pyridine gas has relatively large pKa of about 5.67, and the pyridine gas having pKa of 7 or more can be suitably used as the catalyst gas. This point is the same as step 1a.

After the SiO layer is formed, the valves 243b and 243a are closed, and the supply of the $H_2O$ gas and the pyridine gas into the process chamber 201 is stopped. Then, according to the same process procedures as step 1a, the unreacted $H_2O$ gas and pyridine gas remaining in the process chamber 201, the $H_2O$ gas and the pyridine gas after contributing to the formation of the SiO layer, or the reaction by-product is removed from the process chamber 201. At this time, this step is the same as step 1a in that the gases remaining in the process chamber 201 are not completely removed.

In addition to the $H_2O$ gas, for example, an O-containing gas including an O—H bond, such as hydrogen peroxide ($H_2O_2$), that is, a hydroxy group (OH group), can be used as the reactant. In addition, an O-containing gas including no O—H bond, for example, oxygen ($O_2$) gas, ozone ($O_3$) gas, hydrogen ($H_2$) gas+$O_2$ gas, or $H_2$ gas+$O_3$ gas, can be used as the reactant.

In addition to the pyridine gas, for example, the above-mentioned various amine-based gases or non-amine-based gases can be used as the catalyst (second catalyst gas). That is, as the second catalyst gas used in step 1b, a gas having the same molecular structure (chemical structure) as the first catalyst gas used in step 1a, that is, a gas having the same material, can be used. In addition, as the second catalyst gas used in step 1b, a gas having a different molecular structure from the first catalyst gas used in step 1a, that is, a gas having a different material, can be used.

In addition to the N2 gas, for example, the above-described various rare gases can be used as the inert gas.

[Performing Predetermined Number of Times]

Steps 1a and 1b described above are non-simultaneously performed, and the first cycle performed without synchronization is performed a predetermined number of times (m times), that is, once or more. Therefore, as the first layer, a SiO layer having a predetermined composition and a predetermined thickness can be formed on the wafer 200.

The thickness of the SiO layer formed by performing the first cycle once, that is, the cycle rate in the forming of the first layer is not unchangeable and can be finely adjusted by a specific method. For example, the cycle rate in the forming of the first layer can be precisely controlled by appropriately selecting the temperature condition among the process conditions of the forming of the first layer. This is the finding that was revealed for the first time by the intensive research of the inventors or the like. The inventors have confirmed that the cycle rate in the forming of the first layer could be performed for the precise thickness control of 2.0 Å (0.2 nm) by setting the temperature (first temperature) of the wafer 200 to 75° C. and setting the other process conditions to the predetermined conditions within the above-described process condition range when the forming of the first layer was performed. FIG. 4 illustrates an example in which the first layer is formed by performing the first cycle once under the above-described process condition where the first temperature is set to be 75° C., that is, an example in which the SiO layer having a thickness of 2.0 Å is formed as the first layer.

(Temperature Changing)

When the forming of the first layer (SiO layer) on the wafer 200 is completed, the output of the heater 207 is adjusted to change the temperature of the wafer 200 to a second temperature different from the first temperature (75° C.).

For the same reason as described in the forming of the first layer, the second temperature is set to be a temperature within a range of, for example, 0° C. to 150° C., preferably room temperature to 100° C., and more preferably 40° C. to 90° C. As described above, this temperature zone is a temperature at which neither the HCDS gas nor the H$_2$O gas is thermally decomposed when the HCDS gas and the H$_2$O gas are present alone, respectively, in the process chamber 201.

In addition, a difference between the first temperature and the second temperature is set to be, for example, 5° C. to 50° C., preferably 5° C. to 30° C., and more preferably 10° C. to 20° C.

When the difference between the first temperature and the second temperature exceeds 50° C., a difference in film quality between the first layer and the second layer to be described below is increased and characteristics of the SiO film to be finally formed may become non-uniform in the laminating direction. In addition, the time necessary for changing the temperature, that is, the standby time until the temperature of the wafer 200 reaches the second temperature and becomes stable, is increased and the productivity of the substrate processing is easily reduced. When the difference between the first temperature and the second temperature is set to be 50° C. or less, the film quality can become uniform in the first layer and the second layer and characteristics of the SiO film to be finally formed can become uniform in the laminating direction. In addition, it is possible to reduce the above-described standby time and improve the productivity of the substrate processing. When the difference between the first temperature and the second temperature is set to be 30° C. or less, the film quality can become sufficiently uniform in the first layer and the second layer, and also, it is possible to sufficiently reduce the above-described standby time. When the difference between the first temperature and the second temperature is set to be 20° C. or less, the film quality can become uniform in the first layer and the second layer, and also, it is possible to further reduce the above-described standby time.

When the difference between the first temperature and the second temperature is less than 5° C., a difference between the thickness of the SiO layer formed by performing the first cycle once (the cycle rate in the forming of the first layer) and the thickness of the SiO layer formed by performing a second cycle to be described below once (the cycle rate in the forming of the second layer) is reduced, and it is difficult to obtain the effect of improving the film thickness controllability of the SiO film to be finally formed. This can be solved by setting the difference between the first temperature and the second temperature to be 5° C. or more. When the difference between the first temperature and the second temperature is set to be 10° C. or more, it is possible to ensure the difference between the cycle rates described above and to reliably improve the film thickness controllability of the SiO film to be finally formed.

Thus, the difference between the first temperature and the second temperature may set to be 5° C. to 50° C., preferably 5° C. to 30° C., and more preferably 10° C. to 20° C. In the present embodiment, as one example, the difference between the first temperature and the second temperature is set to be 15° C. and the second temperature is set to be 90° C.

(Forming of Second Layer)

When the temperature of the wafer 200 reaches the second temperature and becomes stable, the forming of the second layer is performed.

In this step, step 2a of supplying an HCDS gas and a pyridine gas to the wafer 200 in the process chamber 201 and step 2b of supplying an H$_2$O gas and a pyridine gas to the wafer 200 in the process chamber 201 are sequentially performed. The process procedures and the process conditions of steps 2a and 2b are the same as the process procedures and the process conditions of steps 1a and 1b, except for the temperature of the wafer 200. As the second layer, an SiO layer having a predetermined composition and a predetermined thickness can be formed on the first layer in such a manner that steps 2a and 2b are non-simultaneously performed, and the second cycle performed without synchronization is performed a predetermined number of times (n times), that is, once or more. The composition of the second layer is the same as the composition of the first layer. However, the composition of the second layer may be different from the composition of the first layer.

Like the cycle rate in the forming of the first layer, the thickness of the SiO layer formed by performing the second cycle once, that is, the cycle rate in the forming of the second layer, can be finely controlled by appropriately selecting the temperature condition among the process conditions of the forming of the second layer. Therefore, as in the present embodiment, the cycle rate in the forming of the second layer and the cycle rate in the forming of the first layer can be different from each other by setting the temperature (second temperature) of the wafer 200 in the forming of the second layer to be different from the temperature (first temperature) of the wafer 200 in the forming of the first layer. For example, by setting the second temperature to be higher than the first temperature (second temperature>first temperature), the cycle rate in the forming of the second layer can be made smaller than the cycle rate in the forming of the first layer. In addition, by setting the second temperature to be lower than the first temperature (second temperature<first temperature), the cycle rate in the forming of the second layer can be made larger than the cycle rate in the forming of the first layer.

In the present embodiment, by setting the second temperature to 90° C. higher than the first temperature (75° C.), the cycle rate in the forming of the second layer can be controlled to be 1.5 Å (0.15 nm) smaller than the cycle rate (2.0 Å) of the forming of the first layer. FIG. 4 illustrates an example in which the second layer is formed by performing the second cycle twice under the above-described process condition where the second temperature is set to be 90° C., that is, an example in which the SiO layer having a thickness of 3.0 Å (=1.5 Å×2) is formed as the second layer.

As such, the SiO film where the first layer and the second layer are laminated can be formed on the wafer 200 by sequentially performing: forming the first layer, changing the temperature, and forming the second layer. The SiO film where the first layer and the second layer are laminated is a film that has uniform characteristics in the laminating direction, that is, a film that has no interface between the first layer and the second layer and has inseparable characteristics as the entire film. The SiO film where the first layer having thickness of 2.0 Å and the second layer having a thickness of 3.0 Å are laminated has a film thickness of 5.0 Å.

(Returning to Atmospheric Pressure)

When the forming of the SiO film on the wafer 200 is completed, the valves 243c and 243d are opened and an N2 gas is supplied from the gas supply pipes 232c and 232d into the process chamber 201, and is exhausted from the exhaust pipe 231. The N2 gas acts as a purge gas. Therefore, the inside of the process chamber 201 is purged, so that the reaction by-product or the gas remaining in the process chamber 201 is removed from the process chamber 201 (purging). After that, the atmosphere in the process chamber 201 is replaced with the inert gas (inert gas replacement) and the pressure in the process chamber 201 is returned to the atmospheric pressure (returning to the atmospheric pressure).

(Unloading)

After that, the seal cap 219 is moved downward by the boat elevator 115. The lower end of the manifold 209 is opened and the boat 217 is unloaded from the lower end of the manifold 209 to the outside of the reaction tube 203 in a state in which the processed wafers 200 are held to the boat 217 (boat unloading) It is preferable that the output of the heater 207 is reduced (or stopped) before the boat unloading is started. In this case, lowering the temperature of the heater 207 or the reaction tube 203 is performed in parallel to the boat unloading. Therefore, it is possible to rapidly reduce the temperature in the process chamber 201 (close to the first temperature) and to rapidly start a next film-forming process. However, the reduction (or stop) of the output of the heater 207 may be started after the boat unloading is completed.

After the boat unloading, the shutter 219s is moved and the lower end of the manifold 209 is sealed through the O-ring 220c by the shutter 219s (shutter closing). The processed wafers 200 are unloaded to the outside of the reaction tube 203 and are discharged from the boat 217 (wafer discharging). Incidentally, after the wafer discharging, the empty boat 217 may be loaded into the process chamber 201.

(3) Effects of the Present Embodiment

According to the present embodiment, one or more effects described below can be obtained.

(a) According to the present embodiment, the cycle rate in the forming of the first layer and the cycle rate in the forming of the second layer are set to be different from each other as described above. Therefore, it is possible to improve the film thickness controllability of the SiO film to be finally formed.

Therefore, the film thickness (5.0 Å) of the SiO film formed according to the present embodiment is different from an integer multiple of the cycle rate (2.0 Å) in the forming of the first layer and is also different from an integer multiple of the cycle rate (1.5 Å) in the forming of the second layer. That is, the film thickness of the SiO film formed according to the present embodiment is a film thickness that cannot be realized by repeating the first cycle under the process condition in the forming of the first layer and is also a film thickness that cannot be realized by repeating the second cycle under the process condition in the forming of the second layer.

According to the present embodiment, it is possible to perform an unrealizable extremely-precise film thickness control by just adjusting the number of repetitions of the cycle. Such a precise film thickness control has an important significance, in particular, when an extremely thin film having a thickness of, for example, 1.5 to 10 Å, furthermore 2.5 to 5 Å, is formed.

(b) According to the present embodiment, the cycle rate is controlled as described above by setting the first temperature and the second temperature to be different from each other. Therefore, the film thickness controllability can be improved without reducing the in-plane film thickness uniformity of the SiO film.

Therefore, this is considered as an example of the film thickness control method that can control the cycle rate by changing the supply amount (supply time or supply flow rate) of the HCDS gas or the $H_2O$ gas when the film-forming process is performed by alternately supplying the HCDS gas and the $H_2O$ gas. However, the inventors have revealed from the intensive research that the in-plane film thickness uniformity of the SiO film formed on the wafer 200 was reduced when the supply amount of the HCDS gas or the $H_2O$ gas was changed. The inventors have confirmed that, when the supply amount of the HCDS gas was excessively reduced, a difference in the supply amount of the HCDS gas occurred in the central part and the peripheral part of the wafer 200, causing a reduction in the in-plane film thickness uniformity of the SiO film. In addition, the inventors have confirmed that, when the supply amount of the $H_2O$ gas was excessively increased, the adsorption amount of $H_2O$ on the surface of the wafer 200 was increased, causing a reduction in the in-plane film thickness uniformity of the SiO film.

In contrast, according to the present embodiment, even when the amount of the HCDS gas supplied to the wafer 200 per the first cycle is equal to the amount of the HCDS gas supplied to the wafer 200 per the second cycle, the cycle rate can be controlled as described above by appropriately selecting the temperature condition. In addition, even when the amount of the $H_2O$ gas supplied to the wafer 200 per the first cycle is equal to the amount of the $H_2O$ gas supplied to the wafer 200 per the second cycle, the cycle rate can be controlled as described above by appropriately selecting the temperature condition. That is, according to the present embodiment, the film thickness controllability can be improved without reducing the in-plane film thickness uniformity of the SiO film. In addition, according to the present embodiment, it is possible to increase the reproducibility of the film thickness control and improve the reliability by simplifying the flow rate control or the supply time control of the HCDS gas or the $H_2O$ gas.

Incidentally, the present embodiment shows an example in which the supply flow rate of the HCDS gas per the first cycle is equal to the supply flow rate of the HCDS gas per the second cycle, and the supply time of the HCDS gas per the first cycle is equal to the supply time of the HCDS gas per the second cycle. In addition, the present embodiment shows an example in which the supply flow rate of the $H_2O$ gas per the first cycle is equal to the supply flow rate of the $H_2O$ gas per the second cycle, and the supply time of the $H_2O$ gas per the first cycle is equal to the supply time of the $H_2O$ gas per the second cycle.

(c) Both of the material of the first layer and the material of the second layer are SiO. The chemical structure (molecular structure or chemical composition) of the first layer is the same as the chemical structure (molecular structure or chemical composition) of the second layer. In the film-forming sequence according to the present embodiment, since the temperature dependence is relatively small in terms of the film quality, the high-quality SiO film having a uniform film quality in the film thickness direction can be formed on the wafer 200.

(d) In general, when the temperature raising/lowering characteristics of the substrate processing apparatus are considered, the time necessary for raising the temperature is overwhelmingly short as compared with the time necessary for lowering the temperature. Therefore, in the present embodiment in which the second temperature is set to be higher than the first temperature (the temperature is raised in the middle of the film-forming process), the time necessary for changing the temperature, that is, the total time necessary for the film-forming process, can be significantly reduced as compared with the case where the first temperature is set to be higher than the second temperature (the temperature is lowered in the middle of the film-forming process). As a result, in the present embodiment, it is possible to increase the throughput of the film-forming process and improve the productivity as compared with the case where the first temperature is set to be higher than the second temperature.

(e) The same effects as described above can also be obtained even when a gas except for the HCDS gas is used as the source, a gas except for the $H_2O$ gas is used as the reactant, and a gas except for the pyridine gas is used as the catalyst, at the time of performing the film-forming process.

(4) Modification Examples

The film-forming sequence according to the present embodiment is not limited to the aspect illustrated in FIG. 4, and can be modified as follows.

Modification Example 1

In the film-forming sequence illustrated in FIG. 4, the cycle rate in the forming of the second layer is made smaller than the cycle rate in the forming of the first layer by setting the second temperature to be higher than the first temperature (second temperature>first temperature). However, the present embodiment is not limited to the above aspect.

Figure 5:
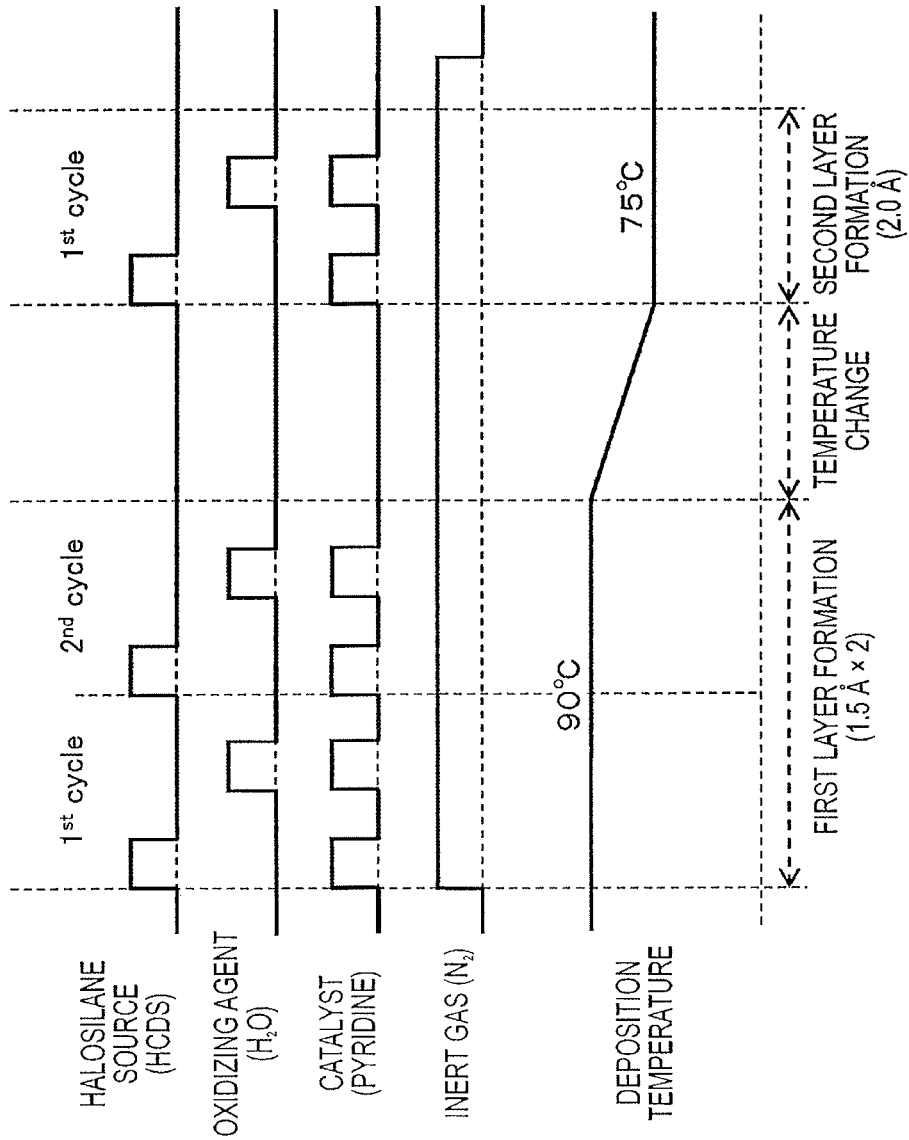
FIG. 5 is a diagram illustrating a modification example of the film-forming sequence according to an embodiment.

For example, as illustrated in FIG. 5, the cycle rate in the forming of the second layer is made larger than the cycle rate in the forming of the first layer by setting the second temperature to be lower than the first temperature (second temperature<first temperature). In the film-forming sequence illustrated in FIG. 5, the first layer (SiO layer) having a thickness of 3 Å (=1.5 Å×2) by setting the temperature (first temperature) of the wafer 200 to 90° C. and performing the first cycle twice, and the second layer (SiO layer) having a thickness of 2.0 Å is formed by changing the temperature (second temperature) of the wafer 200 to 75° C. and performing the second cycle once.

In the present modification example, the same effects as those of the film-forming sequence illustrated in FIG. 4 can also be obtained. In the case of the present modification example, the thickness (3 Å) of the first layer is set to be equal to or greater than the thickness (2 Å) of the second layer. In addition, the number of times of performing the first cycle (twice) is set to be equal to or greater than the number of times of performing the second cycle (once). From these points, the forming of the first layer in the present modification example can be considered as the forming of the body part of the SiO film, and the forming of the second layer in the present modification example can be considered as the finely adjusting of the thickness of the SiO film.

Modification Example 2

In the film-forming sequence illustrated in FIG. 4, after the forming of the first layer is performed, the changing of the temperature is started. After the changing of the temperature is completed, that is, after the temperature of the wafer 200 reaches the second temperature and becomes stable, the forming of the second layer is performed. However, the present embodiment is not limited to the above example.

Figure 6:
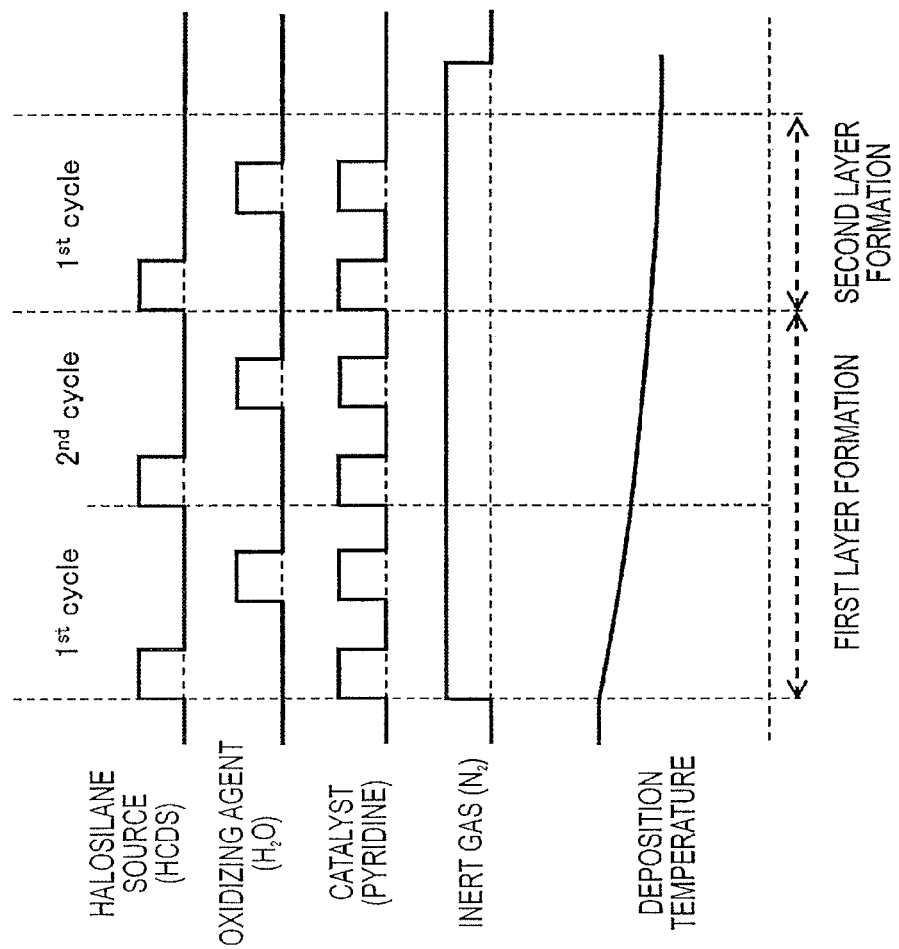
FIG. 6 is a diagram illustrating another modification example of the film-forming sequence according to an embodiment.
Figure 7:
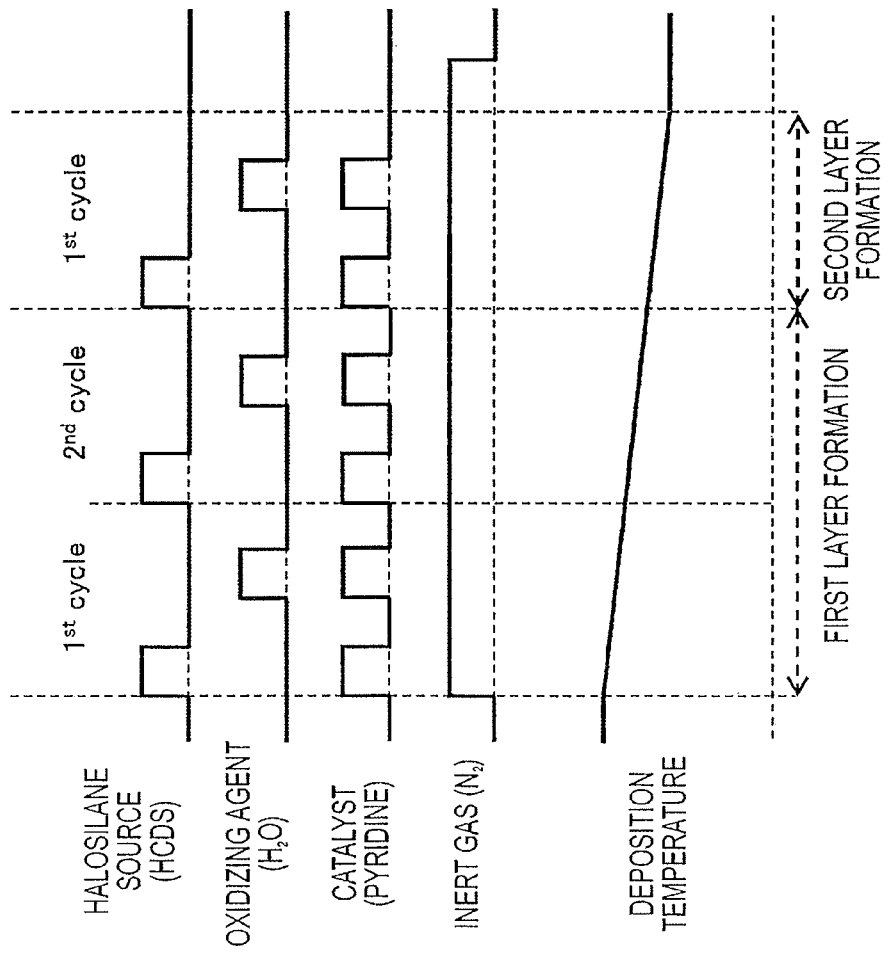
FIG. 7 is a diagram illustrating another modification example of the film-forming sequence according to an embodiment.

For example, as illustrated in FIG. 6, the changing of the temperature may be performed in parallel to the forming of the first layer or the forming of the second layer. That is, the forming of the first layer and the forming of the second layer may be performed while the temperature of the wafer 200 is changed. The film-forming sequence illustrated in FIG. 6 shows an example in which the output of the heater 207 is set to be low (or stopped) at the same as the start of the forming of the first layer, and the forming of the first layer and the forming of the second layer are sequentially performed while the temperature of the wafer 200 is gradually lowered. In addition, the temperature lowering rate of the wafer 200 may be controlled to a desired rate. The film-forming sequence illustrated in FIG. 7 shows an example in which, after the forming of the first layer is started, the forming of the first layer and the forming of the second layer are sequentially performed while the temperature lowering rate is set to a constant rate by gradually changing the set output of the heater 207 with the passage of the processing.

In any of the film-forming sequences, the relationship between the temperature of the wafer 200 and the cycle rate may be determined in advance, the set temperature, the temperature lowering rate, or the like may be set based on the relationship, and the film thickness may be adjusted. In addition, in any of the film-forming sequences, since the forming of the first layer and the forming of the second layer are performed in parallel to the changing of the temperature of the wafer 200, each of the first temperature and the second temperature can be regarded as a temperature zone having a predetermined width (first temperature zone, second temperature zone).

In the present modification example, the cycle rate in the forming of the first layer and the cycle rate in the forming of the second layer can be made different from each other, and the same effects as those of the film-forming sequence illustrated in FIG. 4 can also be obtained.

Modification Example 3

In the film-forming sequence illustrated in FIG. 4, the film-forming temperature is changed by two steps, and the film-forming process is performed by using the two-step cycle rate. However, the film-forming temperature may be changed by three steps, and the film-forming process may be performed by using the three-step cycle rate. In the present modification example, the same effects as those of the film-forming sequence illustrated in FIG. 4 can also be obtained. In addition, by performing the film-forming process by using the three-step cycle rate, it is possible to improve the film thickness controllability of the SiO film to be finally formed.

Modification Example 4

In the film-forming sequence illustrated in FIG. 4, the SiO film is formed under the low temperature condition of non-plasma by using the pyridine gas as the catalyst. However, the film-forming process may be performed under the low temperature condition using plasma, without using the catalyst such as the pyridine gas. In this case, each of the forming of the first layer and the forming of the second layer may include performing a cycle a predetermined number of times, the cycle including non-simultaneously performing: supplying the BTBAS gas to the wafer 200, and supplying the plasma-excited O₂ gas (O₂*) to the wafer 200.

(BTBAS→$O_2$*)×$m$→temperature change→(BTBAS→$O_2$*)×$n$ ⇒$SiO$

In the supplying of the plasma-excited O₂ gas to the wafer 200, the supply flow rate of the O₂ gas, which is controlled by the MFC 241b, is set to a flow rate within a range of, for example, 100 sccm to 10,000 sccm. The RF power, which is applied between the rod-shaped electrodes 269 and 270, is set to power within a range, for example, 50 W to 1,000 W. The pressure in the process chamber 201 is set to a pressure within a range of, for example, 1 Pa to 500 Pa, and preferably 1 Pa to 100 Pa. The other process procedures and the process conditions are the same as the process procedures and the process conditions in the film-forming sequence illustrated in FIG. 4. In the present modification example, the same effects as those of the film-forming sequence illustrated in FIG. 4 can also be obtained.

Other Embodiments of the Present Invention

So far, the embodiments of the present invention have been specifically described. However, the present invention is not limited to the above-described embodiments, and various modifications can be made thereto without departing from the scope of the present invention.

For example, in the above-described embodiment, the example in which the reactant is supplied after the source is supplied has been described. However, the present invention is not limited to the embodiment, the supply order of the source and the reactant may be reversed. That is, the source may be supplied after the reactant is supplied. By changing the supply order, it is possible to change the film quality or the composition ratio of the film to be formed.

In addition, in the above-described embodiment, the example in which the chlorosilane source gas is used as the source gas has been described. The present invention is not limited to the embodiment. Besides the chlorosilane source gas, the halosilane source gas, for example, the fluorosilane source gas or the bromosilane source gas, may be used. The process condition at this time can be the same as the process condition of the above-described embodiment.

When the silicon-based insulating film formed by the method of the above-described embodiment is used as a sidewall spacer, it is possible to provide a device formation technology having a small leakage current and excellent processability. In addition, when the above-described silicon-based insulating film is used as an etch stopper, it is possible to provide a device formation technology having excellent processability. Moreover, except for some modification examples, since the silicon-based insulating film can be formed without using plasma, it is possible to apply to a process having concerns about plasma damage, such as an SADP film or the like of DPT.

In the above-described embodiments, the example in which the SiO film is formed on the wafer 200 has been described. The present invention is not limited to the embodiment. The present invention can be suitably applied to a case where a Si-based oxide film such as a silicon oxycarbide film (SiOC film), a silicon oxycarbonitride film (SiOCN film), or a silicon oxynitride film (SiON film) is formed on the wafer 200. For example, the present teachings can also be suitably applied to a case where a SiOC film is formed on the wafer 200 through the following film-forming sequence. The process condition at this time can be the same as the process condition of the above-described embodiment.

(BTCSM+pyridine→$H_2O$+pyridine)×$m$→temperature change→(BTCSM+pyridine→$H_2O$+pyridine)× $n$⇒SiOC (TCDMDS+pyridine→$H_2O$+pyridine)×$m$→temperature change→(TCDMDS+pyridine→$H_2O$+pyridine)×$n$⇒SiOC In addition, the present teachings can be preferably applied to a case where an oxide film including a metal element such as titanium (Ti), zirconium (Zr), hafnium (Hf), tantalum (Ta), niobium (Nb), aluminum (Al), molybdenum (Mo), or tungsten (W), that is a metal-based oxide film, is formed on the wafer 200. That is, the present teachings can be suitably applied to a case where a TiO film, a ZrO film, an HfO film, a TaO film, an NbO film, an AlO film, a MoO film, or a WO film is formed on the wafer 200.

For example, the present teachings can be suitably applied to a case where a titanium oxide film (TiO film), a hafnium oxide film (HfO film), or the like is formed on the wafer 200 through the following film-forming sequence by using a titanium tetrachloride (TiCl₄) gas, a hafnium tetrachloride (HfCl₄), a tetrakis(dimethylamino)titanium (Ti[N(CH₃)₂]₄, abbreviated to TDMAT) gas, a tetrakis(ethylmethylamino) hafnium (Hf[N(C₂H₅) (CH₃)]₄, abbreviated to TEMAH) gas, or the like as the source gas.

($TiCl_4$→$H_2O$+pyridine)×$m$→temperature change→ ($TiCl_4$→$H_2O$+pyridine)×$n$⇒$TiO$ ($HfCl_4$→$H_2O$+pyridine)×$m$→temperature change→ ($HfCl_4$→$H_2O$+pyridine)×$n$⇒$HfO$

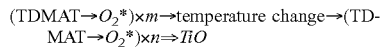

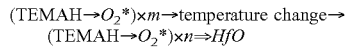

That is, the present teachings can be suitably applied to a case where an oxide film including a semiconductor element or a metal element is formed under a low temperature condition. The process procedures and the process conditions of the film-forming process can be the same as the process procedures and the process conditions in the above-described embodiments or modification examples. In this case, the same effects as those of the above-described embodiment can also be obtained.

It is preferable that the process recipes (program in which the process procedures or process conditions are specified) are separately prepared according to the contents of the processing (type of a film to be formed, a composition ratio, film quality, film thickness, process procedures, process conditions, etc.), and are stored in the memory device 121*c* through the telecommunication line or the external memory device 123. It is preferable that, when the substrate processing is started, the CPU 121*a* appropriately selects a suitable recipe from the plurality of recipes stored in the memory device 121*c* according to the contents of the processing. Due to this, films having various film types, composition ratios, film qualities, and film thicknesses can be formed with excellent reproducibility by a single substrate processing apparatus. In addition, since the workload of an operator (input/output load of the process procedures, process conditions, etc.) can be reduced, the substrate processing can be promptly started while avoiding erroneous operations.

The above-described recipe is not limited to the case of newly creating a process recipe. For example, the process recipe may be prepared by modifying an existing recipe having already been installed on the substrate processing apparatus. When the recipe is modified, the modified recipe may be installed on the substrate processing substrate through the telecommunication line or the non-transitory computer-readable recording medium storing the corresponding recipe. In addition, the existing recipe having already been installed on the substrate processing apparatus may be directly modified by operating the I/O device 122 provided in the existing substrate processing apparatus.

In the above-described embodiments, the example of forming the film by using a batch-type substrate processing apparatus which processes a plurality of substrates at a time has been described. However, the present teachings are not limited to the above-described embodiments. For example, the present teachings can be suitably applied to the case of forming a film by using a single-wafer-type substrate processing apparatus which processes one substrate or a plurality of substrates at a time. In addition, in the above-described embodiments, the example of forming the film by using a hot-wall-type substrate processing apparatus has been described. However, the present teachings are not limited to the above-described embodiments. For example, the present teachings can be preferably applied to the case of forming a film by using a cold-wall-type substrate processing apparatus. In these cases, the process procedures and the process conditions can be the same as, for example, the process procedures and the process conditions of the above-described embodiments.

Figure 13:
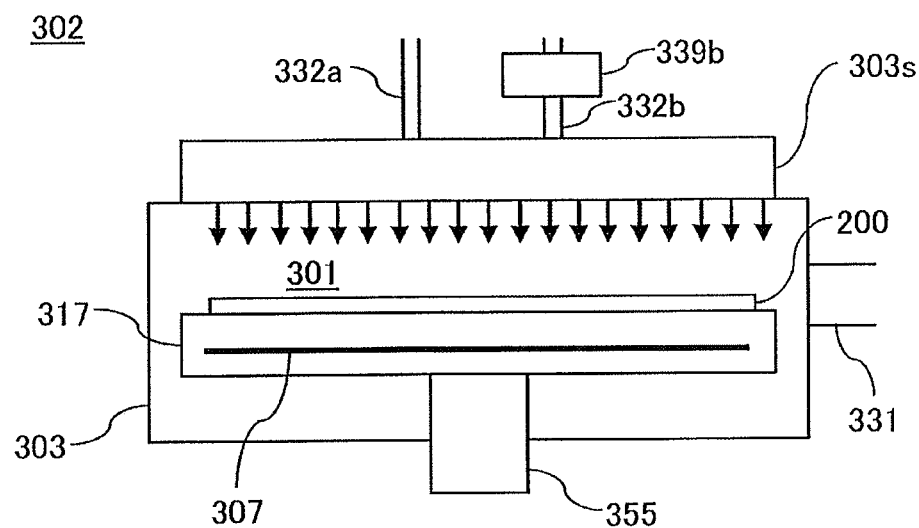
FIG. 13 is a schematic configuration diagram of a process furnace of a substrate processing apparatus suitably used in another embodiment and a longitudinal sectional view of a process furnace part.

For example, the present teachings can also be suitably applied to a case in which a film is formed by using a substrate processing apparatus including a process furnace 302 illustrated in FIG. 13. The process furnace 302 includes a process vessel 303 configured to form a process chamber 301, a shower head 303*s* serving as a gas supply section configured to supply a gas into the process chamber 301 in a shower shape, a support table 317 configured to support one sheet or a plurality of sheets of wafers 200 in a horizontal posture, a rotational shaft 355 configured to support the support table 317 from below, and a heater 307 provided in the support table 317. Gas supply ports 332*a* and 332*b* are connected to an inlet (gas inlet) of the shower head 303*s*. The same supply systems as the first supply system and the third supply system of the above-described embodiment are connected to the gas supply port 332*a*. A remote plasma section (plasma generation device) 339*b* serving as an excitation section configured to excite a gas by plasma and supply the plasma-excited gas, and the same supply system as the second supply system and the third supply system of the above-described embodiment are connected to the gas supply port 332*b*. A gas distribution plate configured to supply a gas into the process chamber 301 in a shower shape is provided in an outlet (gas outlet) of the shower head 303*s*. The shower head 303*s* is provided at a position opposite to (facing) the surface of the wafer 200 loaded into the process chamber 301. An exhaust port 331 configured to exhaust the inside of the process chamber 301 is provided in the process vessel 303. The same exhaust system as the exhaust system of the above-described embodiment is connected to the exhaust port 331.

Figure 14:
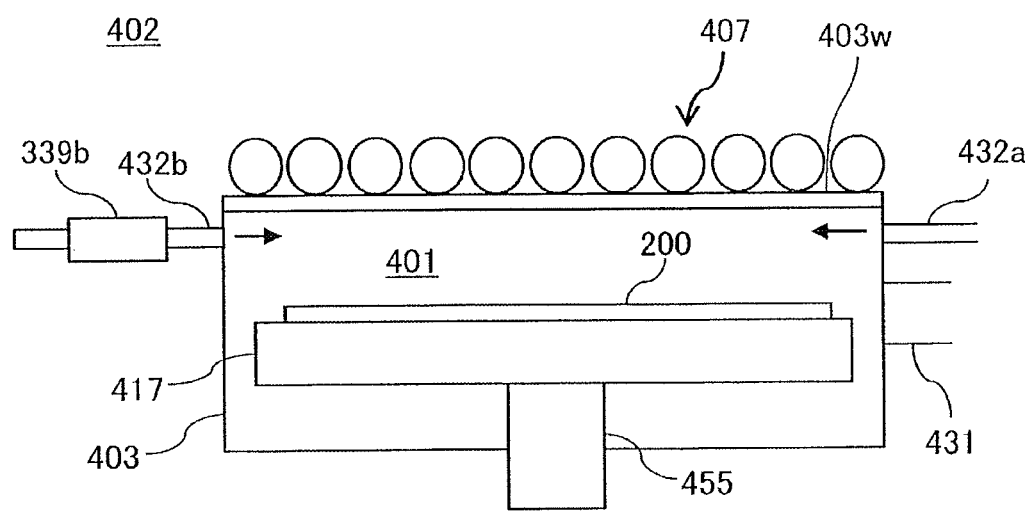
FIG. 14 is a schematic configuration diagram of a process furnace of a substrate processing apparatus suitably used in another embodiment and a longitudinal sectional view of a process furnace part.

In addition, for example, the present teachings can also be suitably applied to a case in which a film is formed by using a substrate processing apparatus including a process furnace 402 illustrated in FIG. 14. The process furnace 402 includes a process vessel 403 configured to form a process chamber 401, a support table 417 configured to support one sheet or a plurality of sheets of wafers 200 in a horizontal posture, a rotational shaft 455 configured to support the support table 417 from below, a lamp heater 407 configured to irradiate light toward the wafers 200 in the process vessel 403, and a quartz window 403*w* configured to transmit the light of the lamp heater 407. Gas supply ports 432*a* and 432*b* are connected to the process vessel 403. The same supply systems as the first supply system and the third supply system of the above-described embodiment are connected to the gas supply port 432*a*. The above-described remote plasma section 339*b*, and the same supply systems as the second supply system and the third supply system of the above-described embodiment are connected to the gas supply port 432*b*. The gas supply ports 432*a* and 432*b* are provided at sides of edges of the wafers 200 loaded into the process chamber 401, that is, positions that are not opposite to the surfaces of the wafers 200 loaded into the process chamber 401. An exhaust port 431 configured to exhaust the inside of the process chamber 401 is provided in the process vessel 403. The same exhaust system as the exhaust system of the above-described embodiment is connected to the exhaust port 431.

Even when such a substrate processing apparatus is used, the film-forming process can be performed under the same process procedures and process conditions as those of the above-described embodiments and modification examples, and the same effects as those of the above-described embodiments or modification examples can be obtained.

In addition, the above-described embodiments or modified examples can be used in combination as appropriate. Moreover, the process conditions at this time can be the same as, for example, the process conditions of the above-described embodiments.

Preferred Aspects of the Present Invention

Hereinafter, preferred aspects of the present teachings will be supplementarily described.

(Supplementary Note 1)

According to one aspect of the present teachings, there is provided a method of manufacturing a semiconductor device or a substrate processing method including: forming a film where a first layer and a second layer are laminated on a substrate by performing: (a) forming the first layer by performing a first cycle a predetermined number of times (m times), the first cycle including non-simultaneously performing: (a-1) supplying a source to the substrate, and (a-2) supplying a reactant to the substrate, under a first temperature at which neither the source nor the reactant is thermally decomposed when the source and the reactant are present alone, respectively; and (b) forming the second layer by performing a second cycle a predetermined number of times (n times), the second cycle including non-simultaneously performing: (b-1) supplying the source to the substrate, and (b-2) supplying the reactant to the substrate, under a second temperature at which neither the source nor the reactant is thermally decomposed when the source and the reactant are present alone, respectively, the second temperature being different from the first temperature.

(Supplementary Note 2)

In the method according to Supplementary Note 1, preferably, the method further includes changing (raising or lowering) a temperature of the substrate from the first temperature to the second temperature.

(Supplementary Note 3)

In the method according to Supplementary Note 1 or 2, preferably, a thickness of the first layer is equal to or greater than a thickness of the second layer.

(Supplementary Note 4)

In the method according to any one of Supplementary Notes 1 to 3, preferably, the number of times of performing the first cycle is equal to or greater than the number of times of performing the second cycle.

(Supplementary Note 5)

In the method according to any one of Supplementary Notes 1 to 4, preferably, a body part of the film is formed in (a), and a thickness of the film is finely adjusted in (b)

(Supplementary Note 6)

In the method according to any one of Supplementary Notes 1 to 5, preferably, the first temperature is different from the second temperature, and a cycle rate in the forming of the first layer (a thickness of a layer formed by performing the first cycle once) is different from a cycle rate in the forming of the second layer (a thickness of a layer formed by performing the second cycle once).

(Supplementary Note 7)

In the method according to any one of Supplementary Notes 1 to 6, preferably, a supply amount (a supply time or a supply flow rate) of the source to the substrate per the first cycle is equal to a supply amount (a supply time or a supply flow rate) of the source to the substrate per the second cycle.

(Supplementary Note 8)

In the method according to any one of Supplementary Notes 1 to 7, preferably, a supply amount (a supply time or a supply flow rate) of the reactant to the substrate per the first cycle is equal to a supply amount (a supply time or a supply flow rate) of the reactant to the substrate per the second cycle.

(Supplementary Note 9)

In the method according to any one of Supplementary Notes 1 to 8, preferably, a difference between the first temperature and the second temperature is set to be 5° C. to 50° C. (preferably 5° C. to 30° C. and more preferably 10° C. to 20° C.)

(Supplementary Note 10)

In the method according to any one of Supplementary Notes 1 to 9, preferably, the thickness of the film to be formed on the substrate is different from an integer multiple of the cycle rate in the forming of the first layer.

(Supplementary Note 11)

In the method according to any one of Supplementary Notes 1 to 10, preferably, the thickness of the film to be formed on the substrate is different from an integer multiple of the cycle rate in the forming of the second layer.

(Supplementary Note 12)

In the method according to any one of Supplementary Notes 1 to 11, preferably, the thickness of the film to be formed on the substrate is a thickness within a range of 1.5 Å to 10 Å (preferably 2.5 Å to 5 Å).

(Supplementary Note 13)

In the method according to any one of Supplementary Notes 1 to 12, preferably, each of the first temperature and the second temperature is a temperature within a range of 0° C. to 150° C. (preferably 25° C. to 100° C. and more preferably 40° C. to 90° C.).

(Supplementary Note 14)

In the method according to any one of Supplementary Notes 1 to 13, preferably, a material of the first layer is the same as a material of the second layer. More preferably, a chemical structure (molecular structure) of the first layer is the same as a chemical structure of the second layer. More preferably, a chemical composition of the first layer is the same as a chemical composition of the second layer.

(Supplementary Note 15)

In the method according to any one of Supplementary Notes 1 to 14, preferably, the reactant is an oxidizing agent, and the film formed on the substrate is an oxide film.

(Supplementary Note 16)

In the method according to Supplementary Note 15, preferably, each of (a) and (b) further includes supplying a catalyst to the substrate.

(Supplementary Note 17)

In the method according to Supplementary Note 16, preferably, each of the first cycle and the second cycle includes non-simultaneously performing: supplying the source and the catalyst to the substrate; and supplying the reactant and the catalyst to the substrate.

(Supplementary Note 18)

In the method according to Supplementary Note 16 or 17, preferably, a gas (halosilane gas) containing silicon and a halogen group is used as the source.

(Supplementary Note 19)

In the method according to any one of Supplementary Notes 16 to 18, preferably, a gas ($H_2O$, $H_2O_2$) containing a hydroxy group (OH group) is used as the oxidizing agent.

(Supplementary Note 20)

In the method according to any one of Supplementary Notes 16 to 19, preferably, the cycle rate in the forming of the first layer is made larger than the cycle rate in the forming of the second layer by setting the first temperature to be lower than the second temperature.

(Supplementary Note 21)

In the method according to Supplementary Note 15, preferably, a gas (aminosilane gas) containing silicon and an amino group is used as the source.

(Supplementary Note 22)

In the method according to Supplementary Note 21, preferably, a plasma-excited oxygen-containing gas is used as the oxidizing agent.

(Supplementary Note 23)

According to another aspect of the present teachings, there is provided a substrate processing apparatus including: a process chamber in which a substrate is processed; a first supply system configured to supply a source to the substrate in the process chamber; a second supply system configured to supply a reactant to the substrate in the process chamber; a temperature regulation section configured to regulate a temperature of the substrate in the process chamber; and a control unit configured to control the first supply system, the second supply system, and the temperature regulation section so as to form a film where a first layer and a second layer are laminated on a substrate by performing, in the process chamber: (a) forming the first layer by performing a first cycle a predetermined number of times, the first cycle including non-simultaneously performing: (a-1) supplying a source to the substrate, and (a-2) supplying a reactant to the substrate, under a first temperature at which neither the source nor the reactant is thermally decomposed when the source and the reactant are present alone, respectively; and (b) forming the second layer by performing a second cycle a predetermined number of times, the second cycle including non-simultaneously performing: (b-1) supplying the source to the substrate, and (b-2) supplying the reactant to the substrate, under a second temperature at which neither the source nor the reactant is thermally decomposed when the source and the reactant are present alone, respectively, the second temperature being different from the first temperature.

(Supplementary Note 24)

According to further another aspect of the present teachings, there is provided a program or a non-transitory computer-readable recording medium storing the program configured to cause a computer to perform forming a film where a first layer and a second layer are laminated on a substrate by performing: (a) forming the first layer by performing a first cycle a predetermined number of times, the first cycle including non-simultaneously performing: (a-1) supplying a source to the substrate, and (a-2) supplying a reactant to the substrate, under a first temperature at which neither the source nor the reactant is thermally decomposed when the source and the reactant are present alone, respectively; and (b) forming the second layer by performing a second cycle a predetermined number of times, the second cycle including non-simultaneously performing: (b-1) supplying the source to the substrate, and (b-2) supplying the reactant to the substrate, under a second temperature at which neither the source nor the reactant is thermally decomposed when the source and the reactant are present alone, respectively, the second temperature being different from the first temperature.

What is claimed is:

1. A method of manufacturing a semiconductor device comprising:
    forming a film of a controlled thickness of no more than 10 Å on a substrate comprising of a first layer of a material having a first layer thickness and a second layer of the same material having a second layer thickness such that the controlled thickness is equal to the first layer thickness plus the second layer thickness by:
    (a) forming the first layer by performing a first cycle a first predetermined number of times, the first cycle including non-simultaneously:
        (a-1) supplying a source to the substrate, and
        (a-2) supplying a reactant to the substrate,
    where the first cycle is performed under a first temperature at which neither the source nor the reactant is thermally decomposed when the source and the reactant are present alone, respectively, and results in the addition of a first cycle thickness to the first layer whereby the first layer thickness is equal to the first cycle thickness multiplied by the first predetermined number; and
    (b) forming the second layer by performing a second cycle a second predetermined number of times, the second cycle including non-simultaneously:
        (b-1) supplying the source to the substrate, and
        (b-2) supplying the reactant to the substrate,
    where the second cycle is performed under a second temperature at which neither the source nor the reactant is thermally decomposed when the source and the reactant are present alone, respectively, the second temperature being different from the first temperature, and results in the addition of a second cycle thickness to the second layer whereby the second layer thickness is equal to the second cycle thickness multiplied by the second predetermined number, the first and second cycle thicknesses being different and neither cycle thickness being an integer multiple of the other,
        wherein the controlled thickness of the film formed on the substrate is different from an integer multiple of either the first or second cycle thicknesses, and
        wherein the first layer and the second layer of the film are laminated, the film having uniform characteristics throughout its entire thickness.

2. The method according to claim 1, further comprising changing a temperature of the substrate from the first temperature to the second temperature.

3. The method according to claim 1, wherein the number of times of performing the first cycle is equal to or greater than the number of times of performing the second cycle.

4. The method according to claim 1, wherein a body part of the film is formed in (a), and a thickness of the film is finely adjusted in (b).

5. The method according to claim 1, wherein the first temperature is different from the second temperature.

6. The method according to claim 1, wherein a supply amount of the source to the substrate per the first cycle is equal to a supply amount of the source to the substrate per the second cycle, and a supply amount of the reactant to the substrate per the first cycle is equal to a supply amount of the reactant to the substrate per the second cycle.

7. The method according to claim 1, wherein a difference between the first temperature and the second temperature is set to be 5° C. to 50° C.

8. The method according to claim 1, wherein the controlled thickness of the film to be formed on the substrate is a thickness within a range of 1.5 Å to 10 Å.

9. The method according to claim 1, wherein each of the first temperature and the second temperature is a temperature within a range of 0° C. to 150° C.

10. The method according to claim 1, wherein the reactant is an oxidizing agent, and the film formed on the substrate is an oxide film.

11. The method according to claim 1, wherein each of (a) and (b) further comprises supplying a catalyst to the substrate.

12. The method according to claim 10, wherein each of (a) and (b) further comprises supplying a catalyst to the substrate.

13. The method according to claim 12, wherein each of the first cycle and the second cycle comprises non-simultaneously performing: supplying the source and the catalyst to the substrate; and supplying the reactant and the catalyst to the substrate.

14. The method according to claim 13, wherein a gas containing silicon and a halogen group is used as the source, and a gas containing a hydroxy group is used as the oxidizing agent.

15. The method according to claim 10, wherein a gas containing silicon and an amino group is used as the source, and a plasma-excited oxygen-containing gas is used as the oxidizing agent.

16. The method according to claim 1, wherein a thickness of a layer formed by performing the first cycle once is made larger than a thickness of a layer formed by performing the second cycle once by setting the first temperature to be lower than the second temperature.

17. The method according to claim 1, wherein the difference between the first temperature and the second temperature is set to be 5° C. to 30° C.

18. The method according to claim 1, wherein the difference between the first temperature and the second temperature is set to be 10° C. to 20° C.

19. A non-transitory computer-readable recording medium storing a program configured to cause an apparatus controlled by a computer to perform: forming a film of a controlled thickness of no more than 10 Å on a substrate comprising of a first layer of a material having a first layer thickness and a second layer of the same material having a second layer thickness such that the controlled thickness is equal to the first layer thickness plus the second layer thickness by:
  (a) forming the first layer by performing a first cycle a first predetermined number of times, the first cycle including non-simultaneously:
    (a-1) supplying a source to the substrate, and
    (a-2) supplying a reactant to the substrate,
  where the first cycle is performed under a first temperature at which neither the source nor the reactant is thermally decomposed when the source and the reactant are present alone, respectively, and results in the addition of a first cycle thickness to the first layer whereby the first layer thickness is equal to the first cycle thickness multiplied by the first predetermined number; and
  (b) forming the second layer by performing a second cycle a second predetermined number of times, the second cycle including non-simultaneously:
    (b-1) supplying the source to the substrate, and
    (b-2) supplying the reactant to the substrate,
  where the second cycle is performed under a second temperature at which neither the source nor the reactant is thermally decomposed when the source and the reactant are present alone, respectively, the second temperature being different from the first temperature, and results in the addition of a second cycle thickness to the second layer whereby the second layer thickness is equal to the second cycle thickness multiplied by the second predetermined number, the first and second cycle thicknesses being different and neither cycle thickness being an integer multiple of the other,
  wherein the controlled thickness of the film formed on the substrate is different from an integer multiple of either the first or second cycle thicknesses, and
  wherein the first layer and the second layer of the film are laminated, the film having uniform characteristics throughout its entire thickness.

20. The method according to claim 1, wherein the controlled thickness of the film is 5 Å and one of the first and second cycle thicknesses is 1.5 Å and the other is 2 Å.

21. A substrate processing method comprising:
  forming a film of a controlled thickness of no more than 10 Å on a substrate comprising of a first layer of a material having a first layer thickness and a second layer of the same material having a second layer thickness such that the controlled thickness is equal to the first layer thickness plus the second layer thickness by:
  (a) forming the first layer by performing a first cycle a first predetermined number of times, the first cycle including non-simultaneously:
    (a-1) supplying a source to the substrate, and
    (a-2) supplying a reactant to the substrate,
  where the first cycle is performed under a first temperature at which neither the source nor the reactant is thermally decomposed when the source and the reactant are present alone, respectively, and results in the addition of a first cycle thickness to the first layer whereby the first layer thickness is equal to the first cycle thickness multiplied by the first predetermined number; and
  (b) forming the second layer by performing a second cycle a second predetermined number of times, the second cycle including non-simultaneously:
    (b-1) supplying the source to the substrate, and
    (b-2) supplying the reactant to the substrate,
  where the second cycle is performed under a second temperature at which neither the source nor the reactant is thermally decomposed when the source and the reactant are present alone, respectively, the second temperature being different from the first temperature, and results in the addition of a second cycle thickness to the second layer whereby the second layer thickness is equal to the second cycle thickness multiplied by the second predetermined number, the first and second cycle thicknesses being different and neither cycle thickness being an integer multiple of the other,
  wherein the controlled thickness of the film formed on the substrate is different from an integer multiple of either the first or second cycle thicknesses, and
  wherein the first layer and the second layer of the film are laminated, the film having uniform characteristics throughout its entire thickness.

* * * * *